(12) United States Patent
Patolsky et al.

(10) Patent No.: US 9,773,669 B2
(45) Date of Patent: Sep. 26, 2017

(54) METHOD OF FABRICATING A NANORIBBON AND APPLICATIONS THEREOF

(71) Applicant: Ramot at Tel-Aviv University Ltd., Tel-Aviv (IL)

(72) Inventors: Fernando Patolsky, Rechovot (IL); Guy Davidi, Even-Yehuda (IL); Alexander Pevzner, Kiryat-Ekron (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 109 days.

(21) Appl. No.: 14/849,865

(22) Filed: Sep. 10, 2015

(65) Prior Publication Data

US 2017/0062213 A1  Mar. 2, 2017

Related U.S. Application Data

(60) Provisional application No. 62/048,849, filed on Sep. 11, 2014.

(51) Int. Cl.
| | |
|---|---|
| *H01L 21/20* | (2006.01) |
| *H01L 21/36* | (2006.01) |
| *H01L 21/02* | (2006.01) |
| *H01L 21/3065* | (2006.01) |
| *H01L 29/06* | (2006.01) |
| *H01L 29/16* | (2006.01) |

(52) U.S. Cl.
CPC .... *H01L 21/02606* (2013.01); *H01L 21/0262* (2013.01); *H01L 21/02532* (2013.01); *H01L 21/02603* (2013.01); *H01L 21/02664* (2013.01); *H01L 21/3065* (2013.01); *H01L 29/0669* (2013.01); *H01L 29/16* (2013.01)

(58) Field of Classification Search
CPC ............. H01L 51/0048; H01L 51/5206; H01L 23/53276; H01L 29/0665; H01L 29/0673; H01L 21/02603; H01L 21/02606
See application file for complete search history.

(56) References Cited

U.S. PATENT DOCUMENTS

| | | | | |
|---|---|---|---|---|
| 7,557,367 B2 * | 7/2009 | Rogers | ............... | B82Y 10/00 257/40 |
| 2010/0132773 A1 * | 6/2010 | Lagally | ............... | H01L 31/028 136/255 |
| 2010/0255984 A1 * | 10/2010 | Sutter | ............... | B82Y 30/00 502/185 |
| 2011/0210309 A1 * | 9/2011 | Ben-Ishai | ............... | B82Y 10/00 257/9 |
| 2014/0120714 A1 * | 5/2014 | Farmer | ............... | H01L 21/02603 438/610 |

OTHER PUBLICATIONS

Ben Ishai et al. "Tube-in-Tube and Wire-in-Tube Nano Building Blocks: Towards the Realization of Multifunctional Nanoelectronic Devices", Angewandte Chemie, 121(46): 8855-8858, Oct. 12, 2009.

(Continued)

*Primary Examiner* — Zandra Smith
*Assistant Examiner* — John M Parker

(57) ABSTRACT

A method of fabricating a nanostructure, which comprises forming an elongated tubular nanostructure, and generating conditions for said tubular nanostructure to unwrap.

34 Claims, 15 Drawing Sheets
(6 of 15 Drawing Sheet(s) Filed in Color)

(56) References Cited

OTHER PUBLICATIONS

Ben-Ishai et al. "A Route to High-Quality Crystalline Coaxial Core/Multishell Ge@Si(GeSi)n. and Si@(GeSi)n Nanowire Heterostructures", Advanced Materials, 22(8): 902-906, Feb. 23, 2010.
Ben-Ishai et al. "From Crystalline Germanium-silicon Axial Heterostructures to Silicon Nanowire-Nanotubes", Nano Letters, 12: 1121-1128, Jan. 31, 2012.
Ben-Ishai et al. "Shape- and Dimension-Controlled Single-Crystalline Silicon and SiGe Nanotubes: Toward Nanofluidic FET Devices", Journal of the American Chemical Society, JACS, 131(10): 3679-3689, Published on Web Feb. 18, 2009.
Cui et al. "Nanowire Nanosensors for Highly Sensitive and Selective Detection of Biological and Chemical Species", Science, 293: 1289-1292, Aug. 17, 2001.
Kempa et al. "Single and Tandem Axial P-I-N. Nanowire Photovoltaic Devices", Nano Letters, 8(10): 3456-3460, Published on Web Sep. 3, 2008.
Lauhon et al. "Epitaxial Core-Shell and Core-Multishell Nanowire Heterostructures", Nature, 420(6911): 57-61, Nov. 7, 2002.
Lugstein et al. "Pressure-Induced Orientation Control of the Growth of Epitaxial Silicon Nanowires", Nano Letters, 8(8): 2310-2314, Published on Web Jul. 12, 2008.
Pevzner et al. "Knocking Down Highly-Ordered Large-Scale Nanowire Arrays", Nano Letters, 10: 1202-1208, Published on Web Mar. 3, 2010.
Rogers et al. "Synthesis, Assembly and Applications of Semiconductor Nanomembranes", Nature, 477: 45-53, Sep. 1, 2011.
Shpaisman et al. "Electrochemical Synthesis of Morphology-Controlled Segmented CdSe Nanowires", ACS Nano, 4(4): 1901-1906, Published Online Mar. 25, 2010.

\* cited by examiner

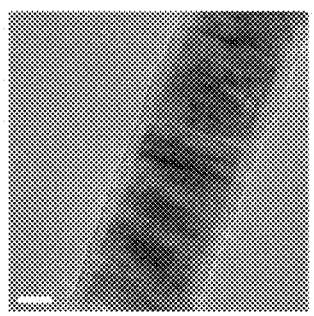
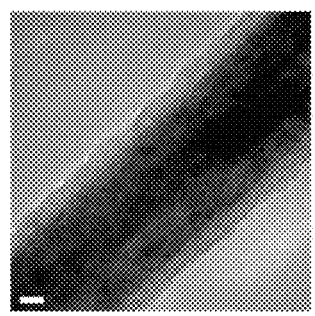
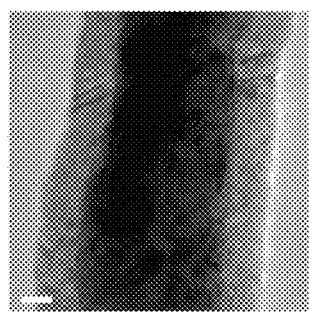
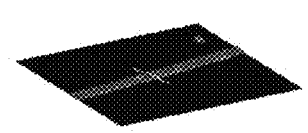
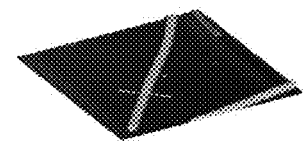
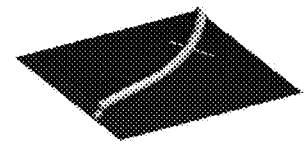
FIG. 3A          FIG. 3B          FIG. 3C
FIG. 3D
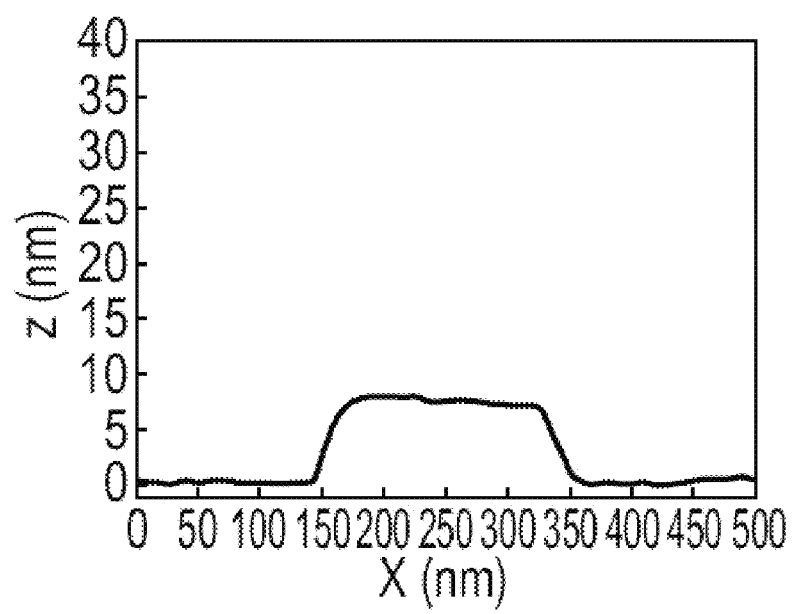

METHOD OF FABRICATING A NANORIBBON AND APPLICATIONS THEREOF

RELATED APPLICATION

This application claims the benefit of priority under 35 USC 119(e) of U.S. Provisional Patent Application No. 62/048,849 filed on Sep. 11, 2014, the contents of which are incorporated herein by reference in their entirety.

FIELD AND BACKGROUND OF THE INVENTION

The present invention, in some embodiments thereof, relates to nanotechnology and, more particularly, but not exclusively, to a method of fabricating a nanoribbon and applications of the nanoribbon.

As the market for low-cost and/or high-performance/density micron- and nano-scale electronic and electromechanical integrated circuits increases, many new assembly techniques investigated and commercialized. At the same time, there has also been a continued interest in scaling to nanometer dimensions the size of individual devices within such integrated circuits. In this respect, nanostructures, and in particular elongated nanostructures such as nanowires and nanotubes, have the potential to facilitate a whole new generation of electronic devices. The small dimensions of electrically-conducting nanowires such as carbon nanotubes make them useful as nano-scale, vertically-connecting wires between circuit device layers as well as in-plane connecting wires between adjacent electrical pads. A major impediment to the emergence of this new generation is the ability to effectively grow and harvest nanowires and other nanostructures that have consistent characteristics.

SUMMARY OF THE INVENTION

According to an aspect of some embodiments of the present invention there is provided a method of fabricating a nanostructure. The method comprises forming an elongated tubular nanostructure, and generating conditions for the tubular nanostructure to unwrap, thereby forming a non-tubular nanostructure.

According to some embodiments of the invention the conditions are generated by etching a portion of the tubular nanostructure along a longitudinal axis of the tubular nanostructure.

According to some embodiments of the invention the tubular nanostructure has a core-shell structure, and the method further comprises selectively removing the core following the etching.

According to some embodiments of the invention the tubular nanostructure is formed on a substrate such that a longitudinal axis is generally parallel to the substrate.

According to some embodiments of the invention the substrate is planar.

According to some embodiments of the invention the substrate is non-planar.

According to some embodiments of the invention the tubular nanostructure is formed on a generally planar substrate such that a longitudinal axis is generally parallel to the substrate.

According to some embodiments of the invention the invention the method comprises forming on the substrate a protective layer having a thickness less than a diameter of the tubular nanostructure, thereby partially burying the tubular nanostructure in the protective layer, wherein the conditions are generated by etching an unburied portion of the tubular nanostructure.

According to some embodiments of the invention the conditions are generated by removing the protective layer.

According to some embodiments of the invention the tubular nanostructure has a core-shell structure, and the method further comprises selectively removing the core following the removal of the protective layer.

According to some embodiments of the invention the forming the protective layer comprises, applying a layer having a thickness of at least the diameter of the tubular nanostructure, and selectively reducing a thickness of the layer to the thickness less than the diameter.

According to some embodiments of the invention the invention the method comprises forming on the substrate a protective layer having a thickness of at least a diameter of the tubular nanostructure. In these embodiments the conditions are optionally and preferably generated by applying an etching process to reduce a thickness of the layer and the tubular nanostructure to a thickness below a diameter of the tubular nanostructure prior to the etching, and selectively removing the protective layer to expose sides of the tubular nanostructure.

According to some embodiments of the invention the tubular nanostructure comprises an inorganic substance.

According to some embodiments of the invention the tubular nanostructure comprises an organic substance.

According to some embodiments of the invention the tubular nanostructure comprises a dielectric substance.

According to some embodiments of the invention the tubular nanostructure comprises a semiconductor inorganic substance.

According to some embodiments of the invention the tubular nanostructure comprises at least one substance selected from the group consisting of silicon (Si), gallium nitride (GaN), titanium (Ti), bismuth (Bi), tellurium (Te), lead (Pb) silicon carbide (SiC), gallium arsenide (GaAs), gallium phosphide (GaP), indium phosphide (InP), indium arsenide (InAs), aluminum nitride (AlN), zinc oxide (ZnO), zinc sulfide (ZnS), indium oxide (InO), indium tin oxide (ITO) and cadmium sulfide (CdS).

According to some embodiments of the invention the tubular nanostructure comprises silicon.

According to some embodiments of the invention the tubular nanostructure, once unwrapped, is made exclusively from silicon.

According to some embodiments of the invention the core comprises at least one substance selected from the group consisting of germanium (Ge), zinc oxide (ZnO), zinc sulfide (ZnS), silicon (Si), gallium nitride (GaN), silver (Ag), gold (Au), a Group II-VI element, a Group III-V element, and a Group IV element.

According to some embodiments of the invention the core is made exclusively of germanium.

According to an aspect of some embodiments of the present invention there is provided a nanostructure system. The system comprises a substrate and a non-tubular nanostructure as disclosed herein.

According to some embodiments of the invention the system comprises a plurality of nanostructures.

According to some embodiments of the invention the system serves as, or being incorporated in, a system selected from the group consisting of an electronic circuitry system, an optoelectronic system, an electromechanical system, a thermoelectric system, an optomechanical system, a sensor, a diode system, a transistor system, a memory system, an imaging system, a display system, a projector display system, an identification tag system and a smart card system.

According to an aspect of some embodiments of the present invention there is provided an article of manufacture. The article of manufacture comprises a tubular nanostructure having an outermost layer, wherein an elongated section of the outermost layer is open such that the outermost layer is cut-open to expose an interior of the tubular nanostructure to an environment outside the outermost layer. The section is optionally and preferably generally parallel to a longitudinal axis of the nanostructure.

According to some embodiments of the invention the section is along an entire length of the nanostructure.

According to some embodiments of the invention the nanostructure is at least partially buried in a protective layer supporting side walls of the nanostructure such that the open section is uncoated by the protective layer.

According to some embodiments of the invention the interior comprises a solid core.

According to some embodiments of the invention the article of manufacture wherein the interior is hollowed.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 1A-F are a schematic illustration of an exemplified unwrapping technique for the formation of nanoribbons, according to some embodiments of the present invention.

Figure 2A:
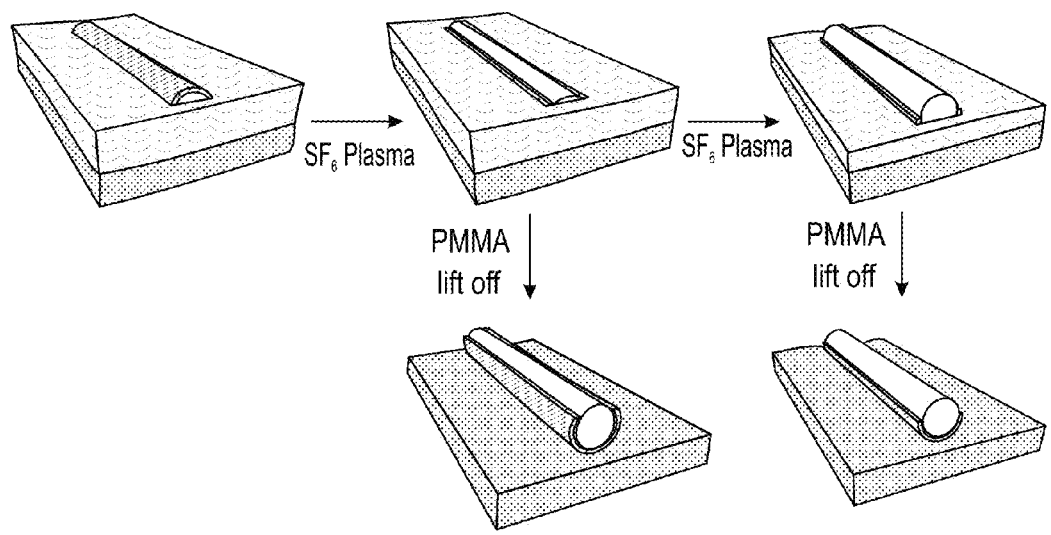

FIG. 2A is a schematic illustration of a diameter control technique of nanoribbons obtained according to some embodiments of the present invention by different etching time applied for top-carving of closed Si shell structure.

FIGS. 2B-F are SEM images of Si nanoribbons with various widths obtained according to some embodiments of the present invention by different etching times applied for top-carving of closed Si 10 nm shell and Ge 50 nm core nanowires. The scale bars are 500 nm.

Figures 2B, 2C, 2D, 2E, 2F:
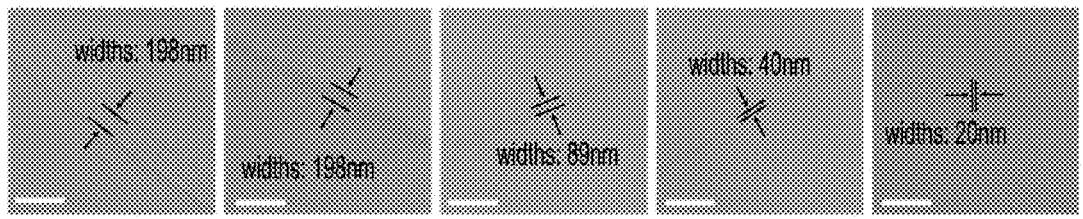
Figures 2G, 2H, 2I:
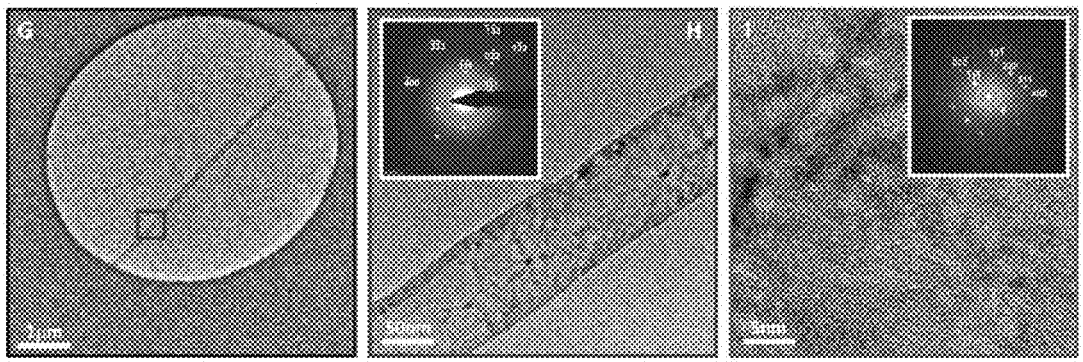

FIGS. 2G-H are TEM images and selected area electron diffraction (SAED) patterns (FIG. 2H, inset).

FIG. 2I is HRTEM image of Si nanoribbon and corresponding fast Fourier transform (FFT) image (inset).

FIGS. 3A-C are TEM images of Si/Ge core-shell nanowires with different thickness before unwrapping, and AFM images of Si nanoribbons with different thickness after unwrapping process, obtained according to some exemplary embodiments of the present invention. (The scale bars are 20 nm).

Figure 3E:
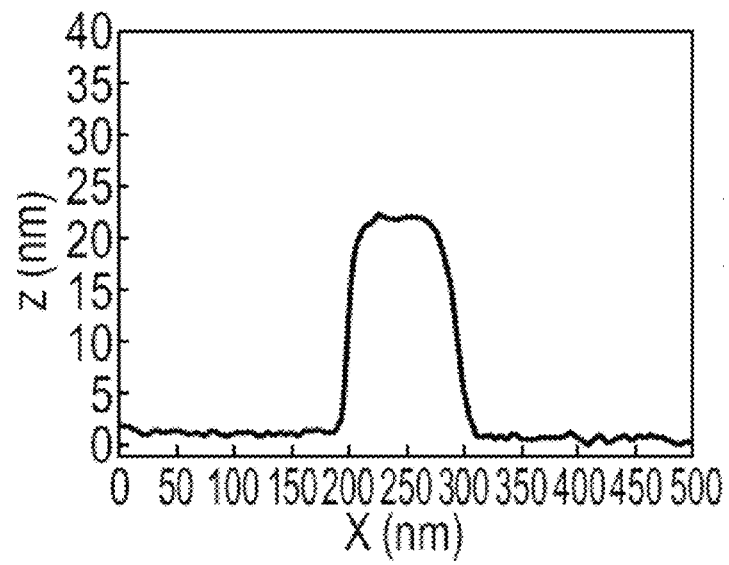
Figure 3F:
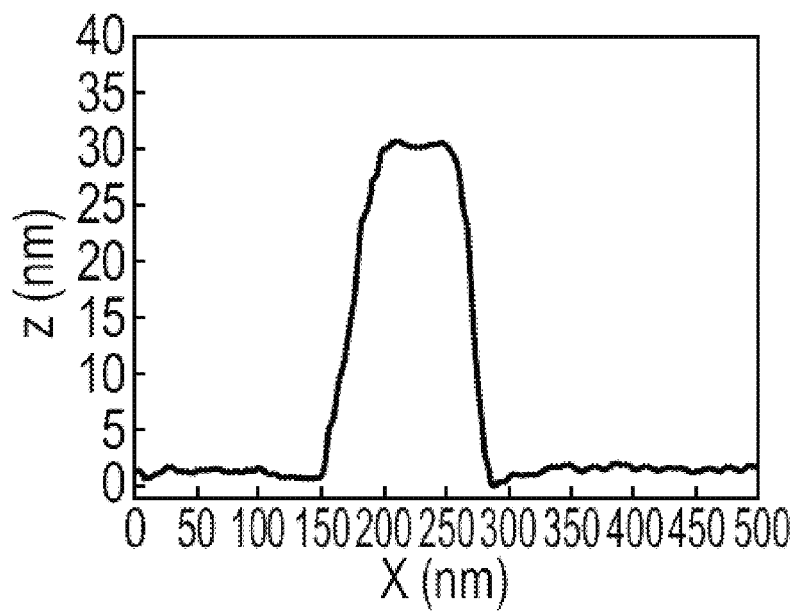

FIGS. 3D-F show thickness profiles of the images in FIGS. 3D-3F.

Figure 4A:
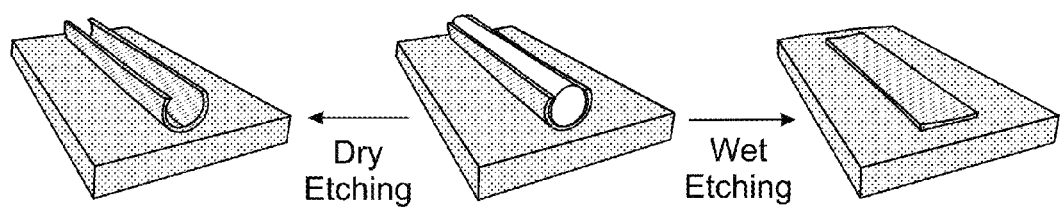

FIG. 4A is a schematic illustration showing wet and dry etching of a Ge core, according to some embodiments of the present invention.

Figure 4B:
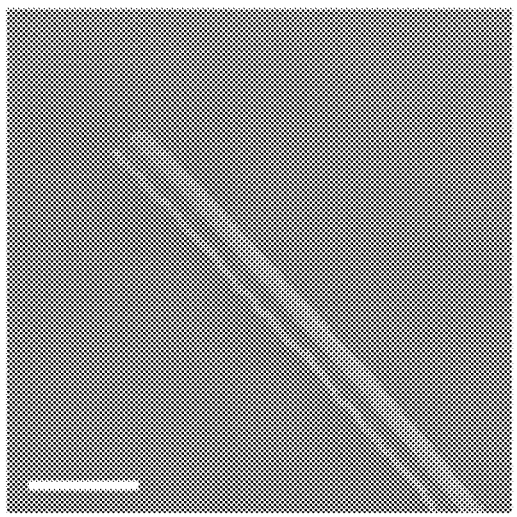
Figure 4C:
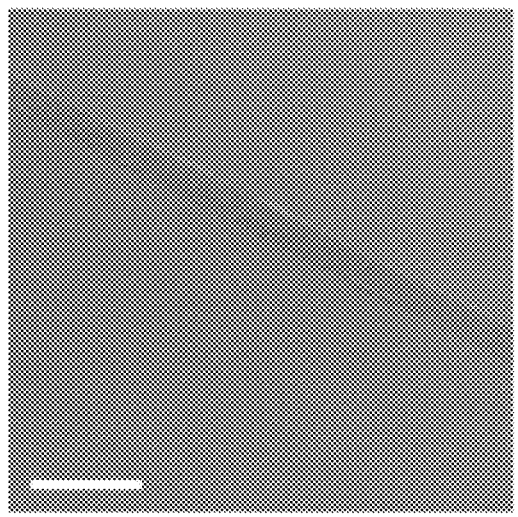

FIGS. 4B and 4C are electron microscope images of Si nanoribbons obtained according to some embodiments of the present invention after dry etching of Ge core (FIG. 4B) and wet etching of Ge core (FIG. 4C). The scale bars are 500 nm.

Figure 5A:
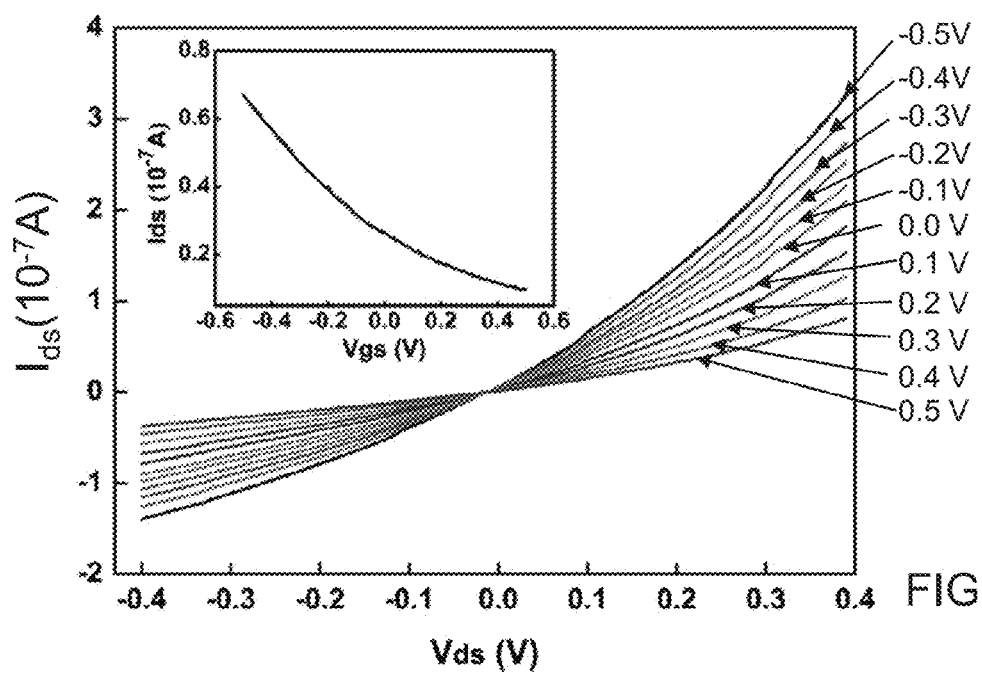

FIG. 5A shows source-drain current ($I_{ds}$) versus source-drain voltage ($V_{ds}$) at different gate voltages ($V_g$) ($V_g$=water gate) for a typical p-type Si nanoribbon FET, as obtained during experiments obtained according to some embodiments of the present invention. Shown are gate voltages of −0.5V, −0.4V, −0.3V, −0.3V, −0.2V, 0.1V, 0.0V, 0.1V, 0.2V, 0.3V, 0.4V and 0.5V. Top inset: $I_{ds}$ versus $V_g$ ($V_g$=water gate) (transconductance curve) recorded for the same p-type Si nanoribbon FET device at a constant $V_{ds}$ of 0.1 V.

Figure 5B:
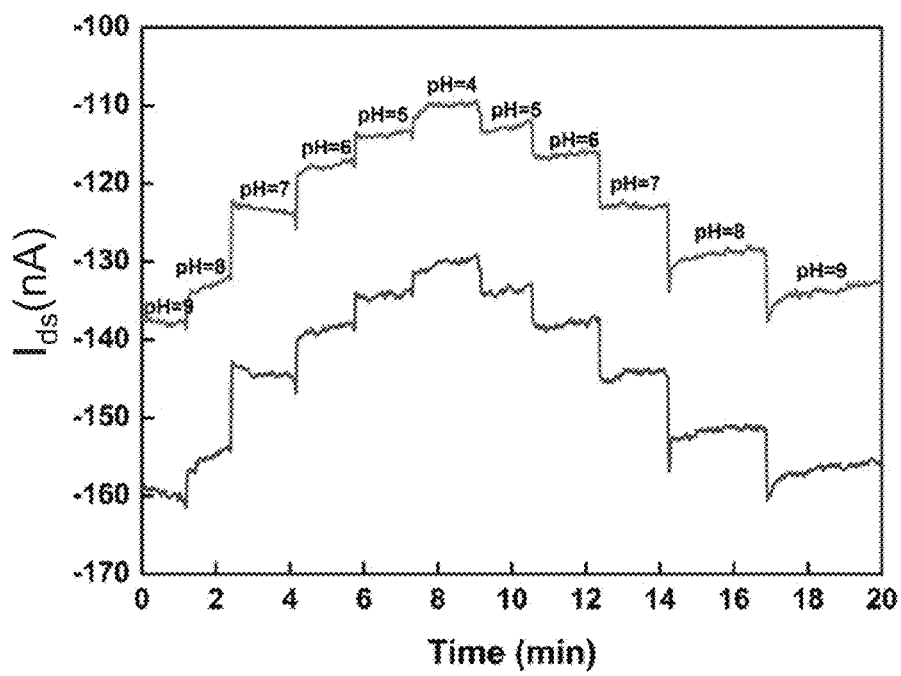

FIG. 5B shows changes in nanoribbons conductance obtained during experiments performed according to some embodiments of the present invention as the pH of solutions delivered to the nanoribbons is varied from 9 to 4 and from 4 to 9.

Figure 6A:
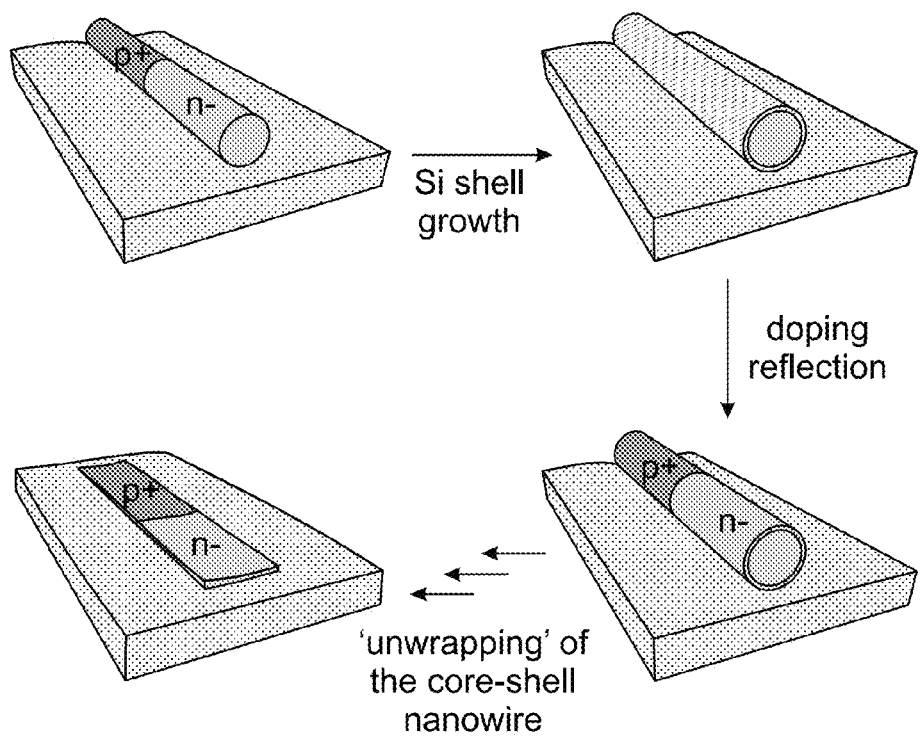

FIG. 6A is a schematic illustration of preparation of p-n Si nanoribbons by a doping reflection procedure, according to some embodiments of the present invention.

Figure 6B:
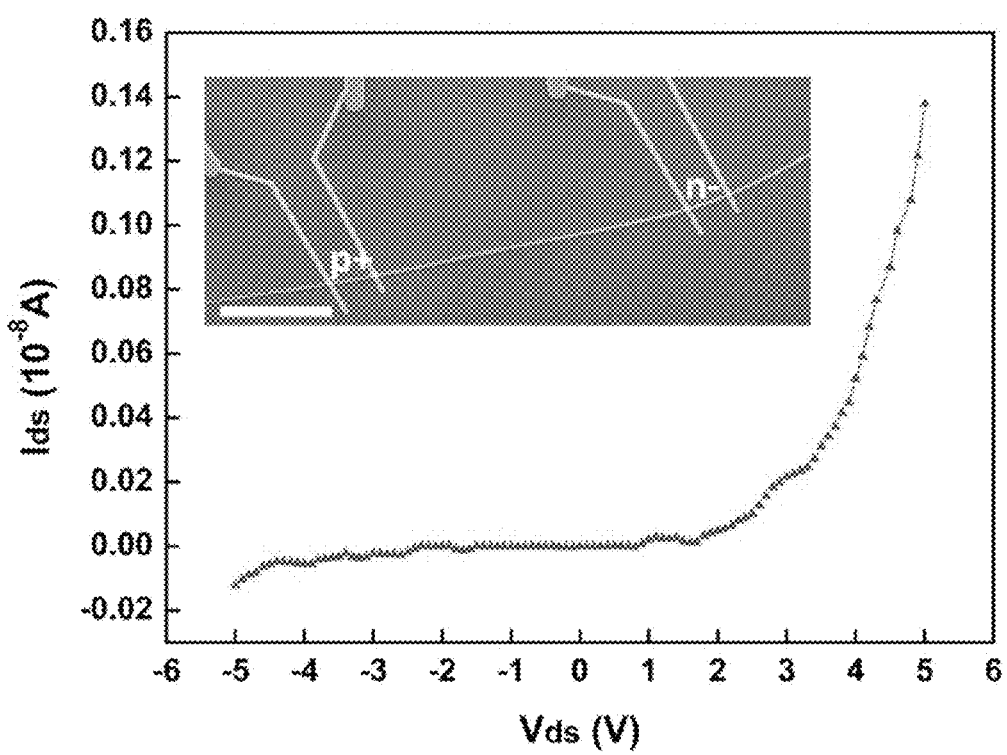

FIG. 6B is an IV curve of a p-n Si nanoribbon obtained according to some embodiments of the present invention by the procedure illustrated in FIG. 6A. Top inset: SEM image of the p-n Si nanoribbon, the scale bar is 5 μm.

Figure 7A:
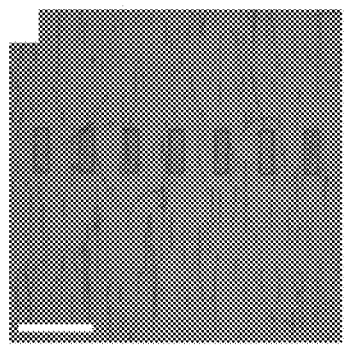
Figure 7B:
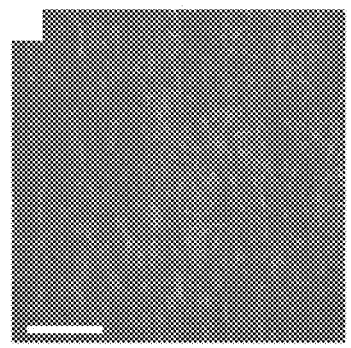
Figure 7C:
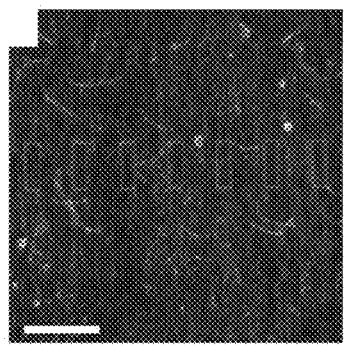
Figure 7D:
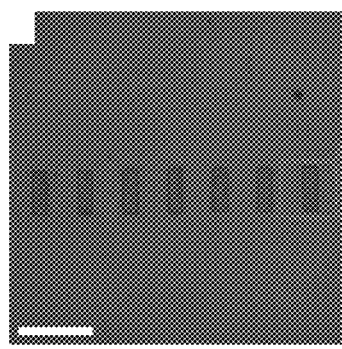
Figure 7E:
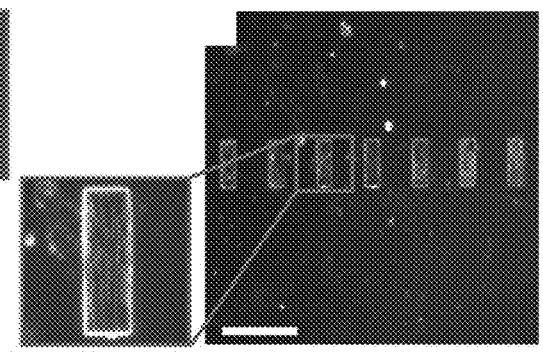

FIGS. 7A-E show large-scale position controlled assembly of nanoribbons on different surfaces, where FIGs. A and D show Si nanoribbons after dry transfer on Si substrate followed by the location-controlled masking on nanoribbons of interest (FIG. 7A), and after surrounding etching (FIG. 7D), FIG. 7B shows Si nanoribbons after dry transfer on PDMS film, and FIGS. 7C and 7E show Si nanoribbons after dry transfer on a flexible film (Kapton, in the present example) followed by the location-controlled masking on nanoribbons of interest (FIG. 7C), and after surrounding etching (FIG. 7E). The scale bars are 50 μm.

Figure 8A:
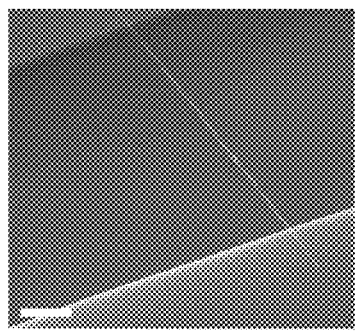
Figure 8B:
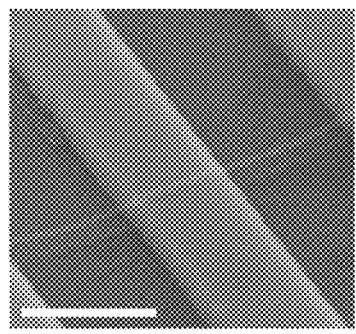
Figure 8C:
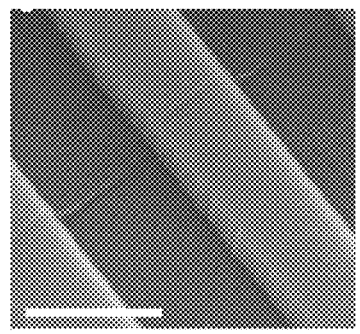

FIGS. 8A-C are SEM images of a 30 nm Si nanowire (FIG. 8A), a Si thicker nanoribbon, about 30 nm in thickness (FIG. 8B), and a Si thinner nanoribbon, less then 15 nm in thickness (FIG. 8C), fabricated according to some embodiments of the present invention on Si 3D sharply-carved substrates. The scale bars are 1 μm.

Figure 9:
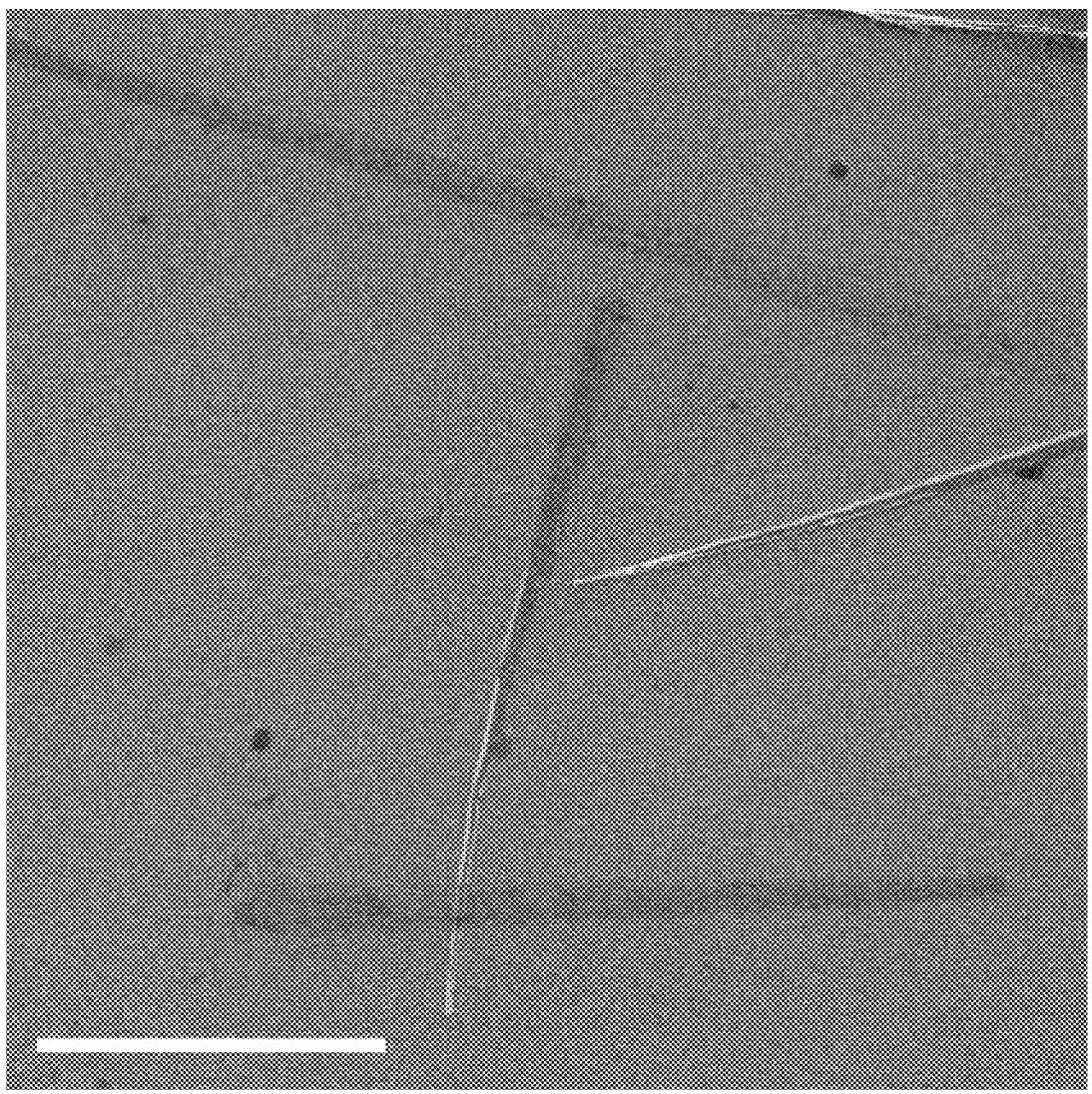

FIG. 9 is a SEM image of pre-designed tapered shape Si nanoribbons, obtained according to some embodiments of the present invention. The scale bar is 5 μm.

Figure 10A:
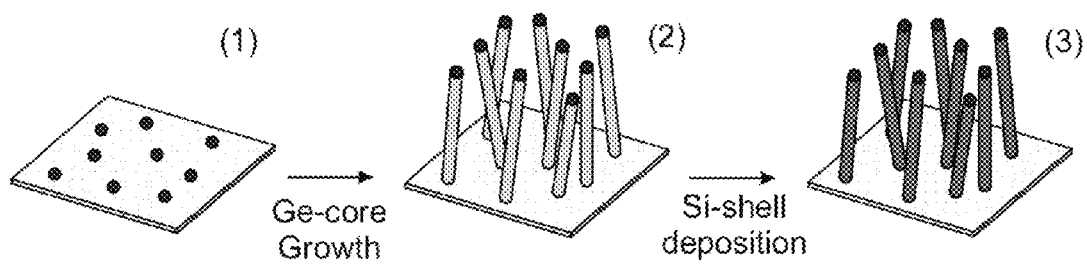

FIG. 10A is a schematic illustration of a synthesis process of Ge—Si core-shell nanowires.

Figures 10B, 10C, 10D:
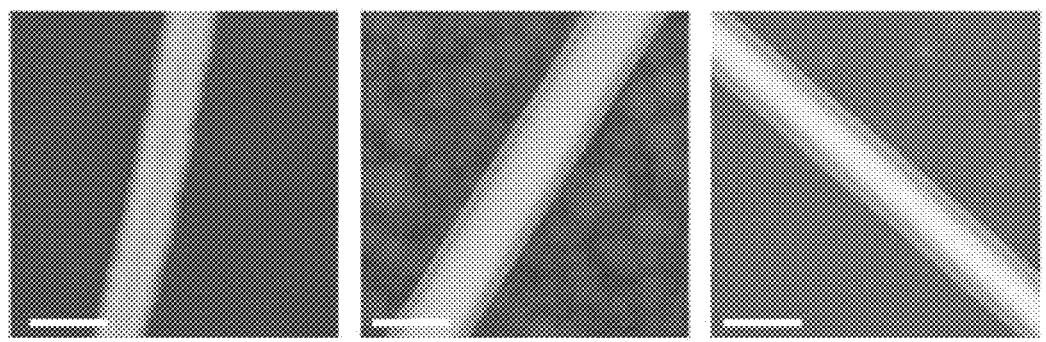

FIGS. 10B-D are mixed SE/BSE (50%/50%) SEM images of Ge—Si core-shell nanowires with various shell thicknesses. The scale bars are 250 nm.

Figure 11:
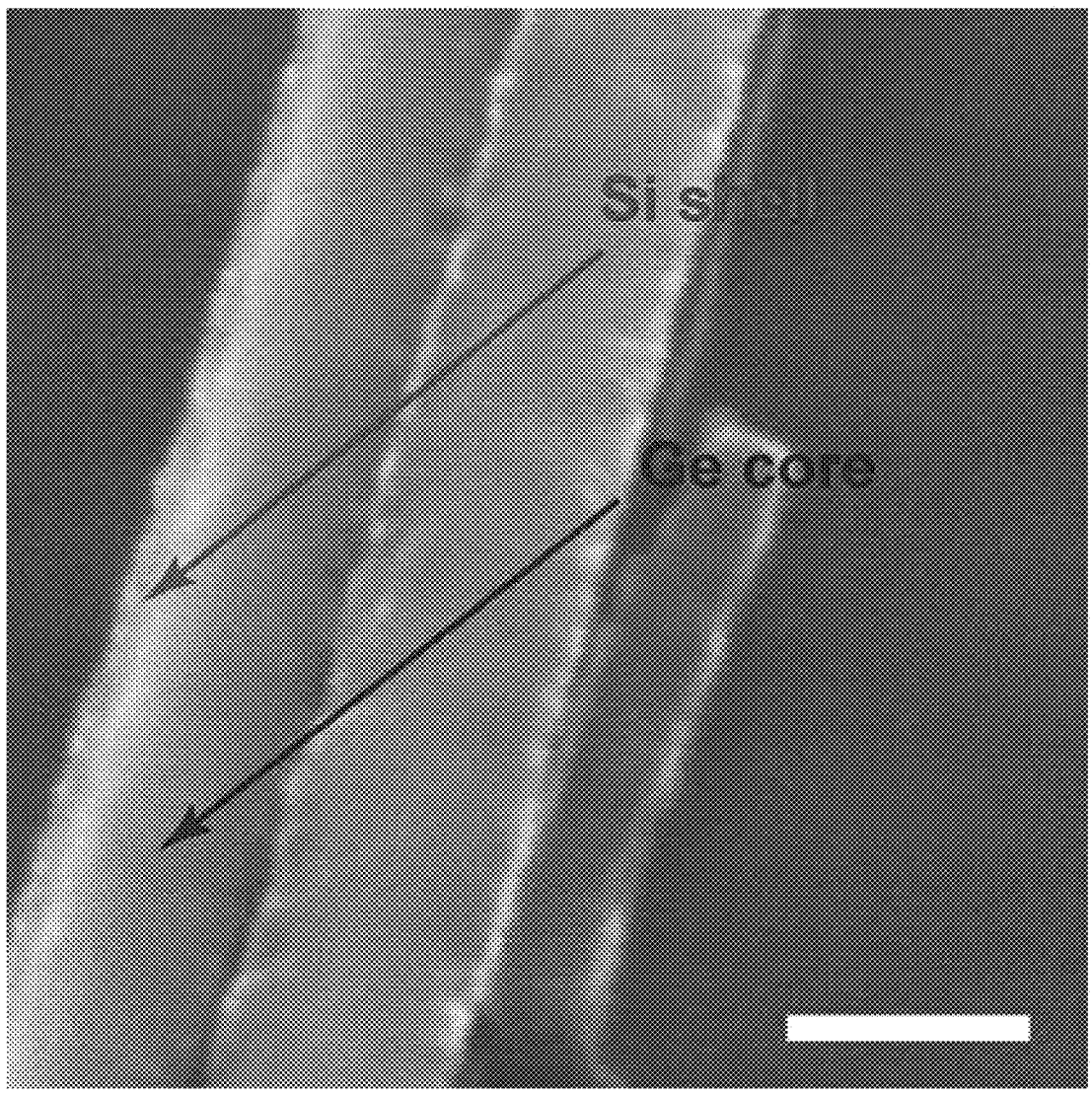

FIG. 11 is a SEM image of top carved Ge—Si core-shell nanowires. The scale bans 100 nm.

Figure 12A:
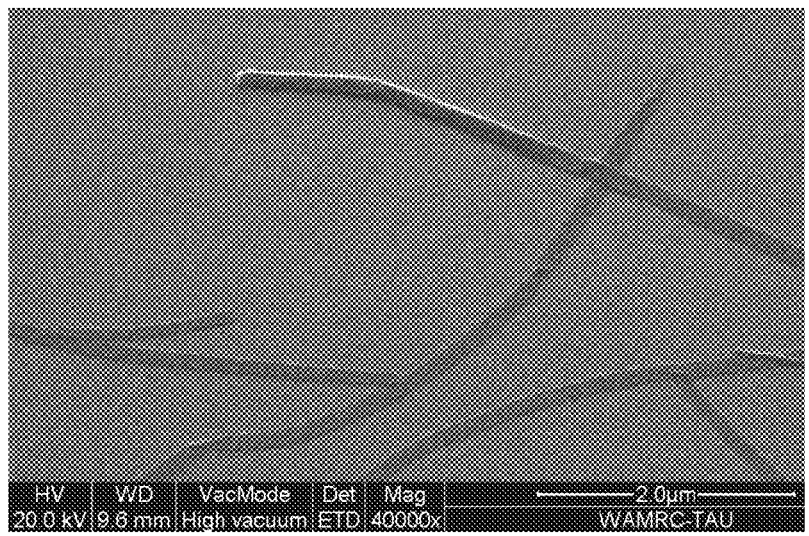
Figure 12B:
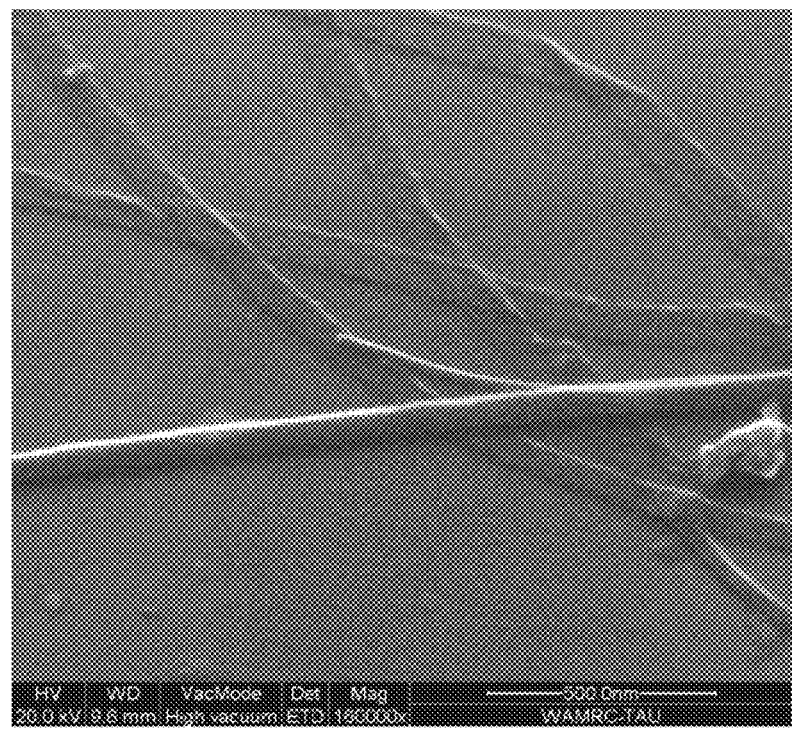

FIGS. 12A-B are electron microscope images of Si nanoribbons after top-carving of Ge—Si core-shell nanowires and wet etching of Ge cores.

Figure 13:
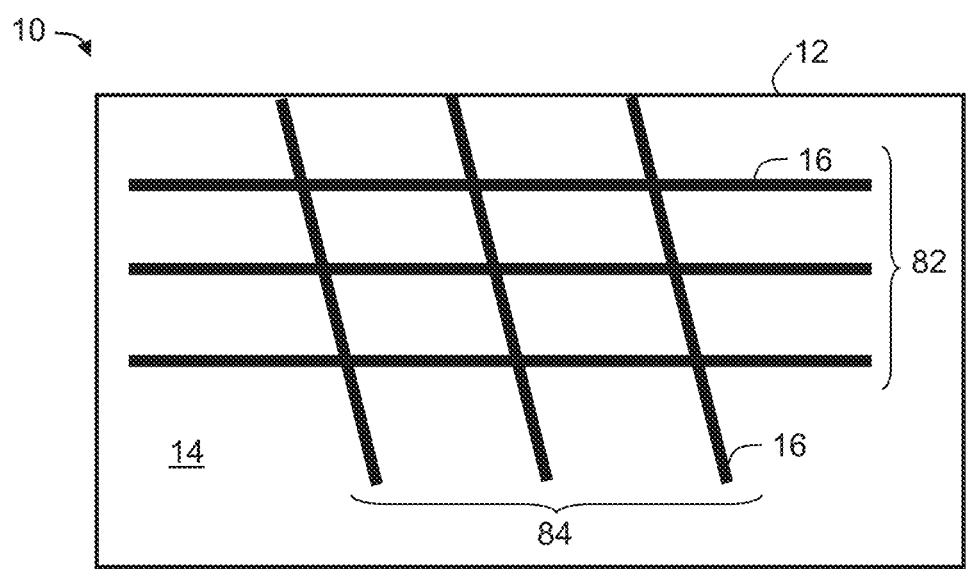

FIG. 13 is a schematic illustration of a nanostructure system, according to some embodiments of the present invention.

Figure 14:
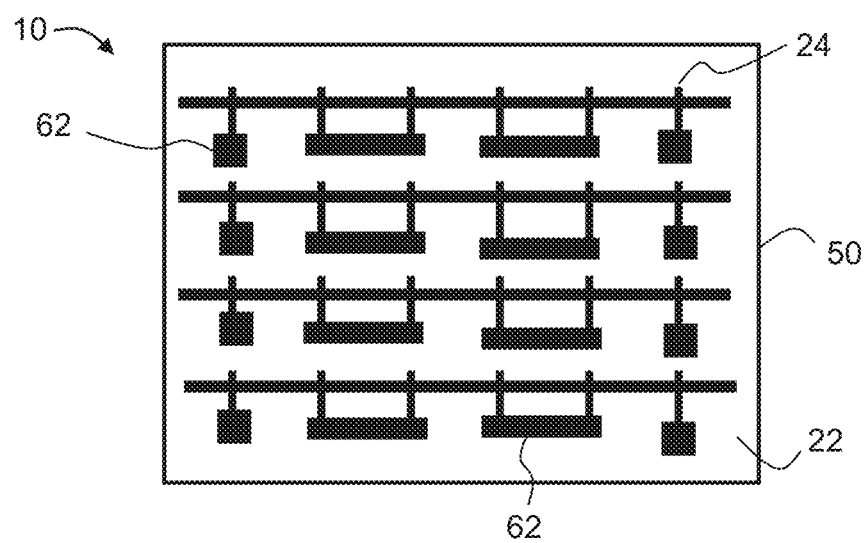

FIG. 14 is a schematic illustration of a circuitry system according to some embodiments of the present invention.

Figure 15:
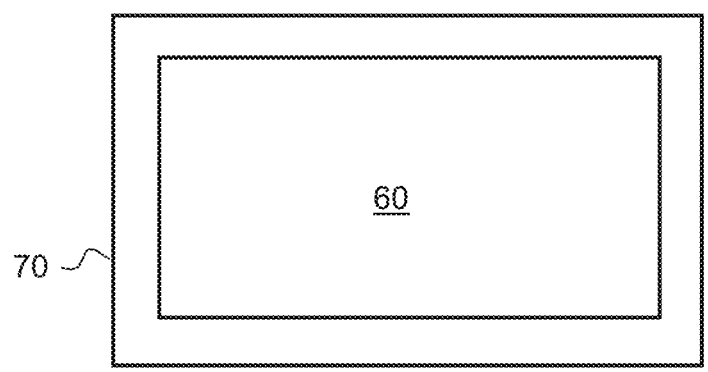

FIG. 15 is a schematic illustration of an appliance which includes a circuitry system according to some embodiments of the present invention.

DESCRIPTION OF SPECIFIC EMBODIMENTS OF THE INVENTION

The present invention, in some embodiments thereof, relates to nanotechnology and, more particularly, but not exclusively, to a method of fabricating a nanoribbon and applications of the nanoribbon.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Some embodiments of the present invention comprise a method of fabricating a nanostructure, by forming an elongated tubular nanostructure, and generating conditions for the tubular nanostructure to unwrap.

As used herein, a "elongated nanostructure" describes a nanoscale object which, at any point along its length, has at least one cross-sectional dimension and, in some embodiments, two orthogonal cross-sectional dimensions less than 1 micron, or less than 500 nanometers, or less than 200 nanometers, or less than 150 nanometers, or less than 100 nanometers, or even less than 70, less than 50 nanometers, less than 20 nanometers, less than 10 nanometers, or less than 5 nanometers. In some embodiments, the cross-sectional dimension can be less than 2 nanometers or 1 nanometer.

In some embodiments, the nanostructure has at least one cross-sectional dimension ranging from about 0.5 nanometers to about 200 nanometers, or from about 1 nm to about 100 nm, or from about 1 nm to about 50 nm.

The length of a nanostructure expresses its elongation extent generally perpendicularly to its cross-section. According to some embodiments of the present invention the length of the nanostructure ranges from about 10 nm to about 50 microns.

The cross-section of the elongated semiconductor may have any arbitrary shape, including, but not limited to, circular, square, rectangular, elliptical and tubular. Regular and irregular shapes are included.

In some embodiments of the invention the nanostructure is formed from a non-hollow structure, referred to herein as "nanowire".

In some embodiments of the present invention the nanowire has a core-shell structure. In these embodiments, the innermost part of the nanowire is, or is part of, the core of the nanowire, and the outermost part is, or is part of, the shell of the nanowire. The present embodiments contemplate a core-shell structure having a multilayer core and/or a multilayer shell.

In some embodiments of the present invention, the nanostructure is shaped as a hollow tube, preferably entirely hollow along its longitudinal axis, referred to herein as "a nanotube".

The nanotube can be single-walled nanotubes, multi-walled nanotube or a combination thereof.

In some embodiments of the present invention the tubular nanostructure comprises an inorganic substance, e.g., a semiconductor inorganic substance.

The phrase "inorganic substance" is used herein to describe non-carbon substances. Accordingly, the nanostructures described herein throughout do not include carbon nanotubes or any other carbon nanostructures.

In some embodiments, the inorganic substance is a metal, a semi-metal, a metal salt, a metal oxide, a metal nitride, a metal phosphide, a metal sulfide, a metal carbide, a metal arsenide, and the likes, a metal alloy, and any combination of the forgoing.

In some embodiments, the inorganic substance is a semiconductor substance. Exemplary semiconductor substances that are suitable for use in embodiments of the invention include, but are not limited to, silicon (Si), gallium nitride (GaN), titanium (Ti), bismuth (Bi), tellurium (Te), lead (Pb) silicon carbide (SiC), gallium arsenide (GaAs), gallium phosphide (GaP), indium phosphide (InP), indium arsenide (InAs), aluminum nitride (AlN), zinc oxide (ZnO), zinc sulfide (ZnS), indium oxide (InO), indium tin oxide (ITO) and cadmium sulfide (CdS).

When the nanostructure has a core shell structure, the core can optionally and preferably be inorganic. Exemplary inorganic substances useful for the core include, but are not limited to, zinc oxide (ZnO), zinc sulfide (ZnS), silicon (Si), gallium nitride (GaN), germanium (Ge), silver (Ag), gold (Au), a Group II-VI element, a Group III-V element, and a Group IV element, as long as the above-indicated crystallinity and susceptibility to selective etching are met.

In some embodiments of the present invention the tubular nanostructure comprises an organic substance.

As used herein, "organic substance" refers to any substance that comprises carbon and hydrogen atoms, with or without additional elements. One example of an organic nanostructure suitable for the present embodiments is a peptide nanostructure. Peptide nanostructures suitable for the present embodiments are described in International Patent Application, Publication Nos. WO2004/052773, WO2004/060791, WO2005/000589, WO2006/027780 and WO2006/013552, the contents of which are hereby incorporated by reference by their entirety.

In some embodiments of the present invention the tubular nanostructure comprises a dielectric substance.

The term "dielectric substance" refers to a substance that causes electric polarization but does not generate direct current electricity upon voltage application.

According to some embodiments of the invention the unwrapping results in a nanoribbon (NR).

As used herein, "nanoribbon" refers to a nanostructure exhibiting thicknesses ranging from a fraction of a nanometer up to about 900 nm, or up to about 800 nm or up to about 700 nm, or up to about 600 nm or up to about 500 nm, or up to about 400 nm or up to about 300 nm or up to about 200 nm, or up to about 100 nm, or up to about 50 nm, or up to about 40 nm, or up to about 30 nm, or up to about 20 nm, or up to about 10 nm, and at least one lateral dimension which is at least one order of magnitude larger than its their thickness. In some embodiments of the present invention the nanoribbon has a width to thickness ratio of from about 1 to about 30 or from about 1.5 to about 30 or from about 2 to about 30 or from about 3 to about 30 or from about 4 to about 30 or from about 5 to about 30 or from about 1 to about 20 or from about 1 to about 10 or from about 1 to about 9 or from about 1 to about 8 or from about 1 to about 7 or from about 1 to about 6 or from about 1 to about 5 or from about 1 to about 4 or from about 1 to about 3 or from about 1 to about 2. The length of the nanoribbon is preferably at least 100 nm or at least 200 nm or at least 400 nm or at least 800 nm or at least 1 µm or at least 2 µm or at least 4 µm or at least 8 µm or at least 10 µm or at least 20 µm or at least 40 µm. In some embodiments of the present invention the nanoribbon is generally planar.

The small thickness provides the NR of the present embodiments with flexural rigidities several orders of magnitude smaller than exhibited by their bulk counterparts. Thus the present embodiments change the nature of the parent material and allow otherwise impossible, non-planar geometry arrangements, where NRs conform and bond to nearly any foreign surface.

The unwrapping of the elongated tubular nanostructure optionally and preferably comprises selective etching. Preferably, anisotropic selective etching is employed. For example, the etching can be selective along a longitudinal axis of the tubular nanostructure. In some embodiments of the present invention a reactive-ion-etching is employed, but other etching procedures, such as, but not limited to, and/or chemical etching, inductively coupled plasma, and cyclotron resonance etching are also contemplated.

In some embodiments, the etching operation is preceded by an operation in which side portions of the nanostructure are covered by, or buried in, a protective layer while keeping other portions (preferably a top portion) exposed. The protective layer is made of a material that sustains the etching such that during the etching operation, the coated or buried portions are not etched. A representative example of a material suitable for use as a protective layer is a photoresist, such as, but not limited to, polymethylmethacrylate (PMMA), SU-8, poly methyl methacrylate-methacrylic acid, and polymethylmethacrylate/(poly methyl methacrylate-methacrylic acid.

The protective layer is preferably deposited onto the nanostructure by spin coating, but other deposition and/or coating techniques such as, but not limited to, dipping, evaporative coating or printing are also contemplated. Following the deposition, the protective layer is optionally and preferably heated. For example, when a PMMA is used, baking to about 180° C. is advantageous.

According to some embodiments of the invention the nanostructure is supported by a substrate such that its longitudinal axis is generally parallel (e.g., with deviation of 10% or less from parallelism) to the substrate and the protective layer, once formed, has a thickness less than the diameter of the tubular nanostructure. In these embodiments the nanostructure is partially buried in the protective layer, and the unwrapping is preferably by etching the unburied portion of the tubular nanostructure.

A partially buried nanostructure can be formed, for example, by applying a protective layer having a thickness of at least the diameter of the tubular nanostructure, and selectively reducing the thickness of the layer to a thickness which is less than the diameter.

Also contemplated are embodiments in which a protective layer having a thickness of at least a diameter of the tubular nanostructure is formed, and an etching process is applied to reduce the thicknesses of the layer as well as the tubular nanostructure to a thickness below the diameter of the tubular nanostructure prior to the etching.

Figure 1B:
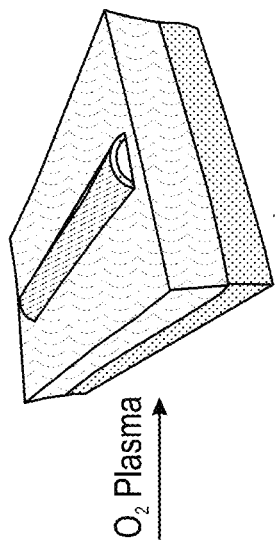
Figure 1C:
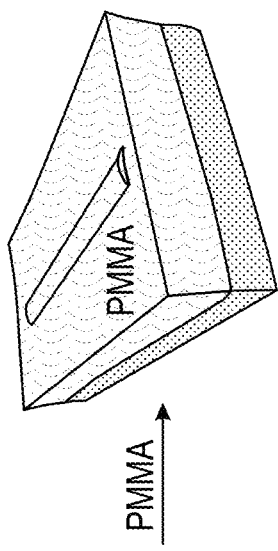
Figure 1E:
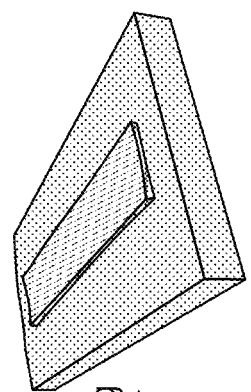
Figure 1E:
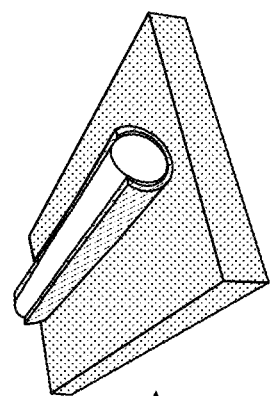
Figure 1F:
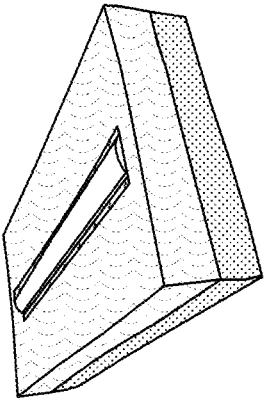

A representative illustration of a technique suitable for protecting the sides of the tubular nanostructure is shown in FIGS. 1A-E. An elongated tubular nanostructure (silicon nanostructure, in the present example) is placed ion a substrate (FIG. 1A). A layer of a protective material (PMMA, in the present example) is deposited on the substrate and the nanostructure (FIG. 2B). The top portion of the protective layer is then removed, for example, by etching ($O_2$ plasma etching, in the present example), such that the top part of the nanostructure is exposed above the protective layer (FIG. 1C). In various exemplary embodiments of the invention the nanostructure is exposed along its entire length. Typically, the exposed portion of the nanostructure protrudes above the top surface of the protective layer.

Figure 1D:
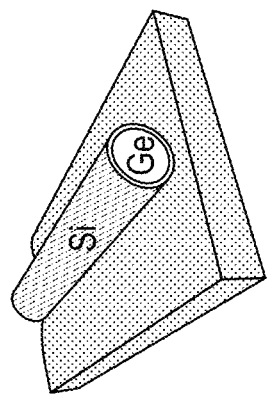

Following the exposure of the top portion of the nanostructure the top portion is removed, for example, by etching ($SF_6$ plasma etching, in the present example) to expose the interior or the nanostructure (FIG. 1D).

The present embodiments thus contemplate an article of manufacture that comprises a tubular nanostructure having an outermost layer, wherein an elongated section of the outermost layer of the tubular nanostructure is open such that the outermost layer is cut-open to expose an interior of the tubular nanostructure to an environment outside the outermost layer, and wherein the section is generally parallel to a longitudinal axis of said nanostructure. Preferably, the cut open tubular elongated nanostructure is buried or partially buried in a protective layer supporting the side walls of the nanostructure such that the open section is uncoated by the protective layer, as illustrated in FIG. 1D.

Once the interior of the nanostructure is exposed, the protective layer can be removed, for example, by a mechanical technique (e.g., lift-off), following the exposure of the interior of the nanostructure (FIG. 1E).

In some embodiments of the invention, the tubular nanostructure is hollow and in some embodiments of the present invention has a core-shell structure with a solid material forming the core. When the tubular nanostructure is hollow, the selective etching along its longitudinal axis (followed by removal of the protective layer, in embodiments in which the nanostructure is partially buried in such a layer) can be sufficient to establish the condition for unwrapping of the nanostructure. When the tubular nanostructure has a core-shell structure, the solid core is preferably removed following the etching along the longitudinal axis. This is illustrated schematically in FIG. 1F. The core can be removed, for example, by etching, wherein the etching procedure is selected based on the material from which the core is made. Preferably, chemical etching is employed, but any of the aforementioned etching techniques are also contemplated, depending on the type of the core.

Representative examples for materials suitable to be used as a solid core in the elongated tubular nano structure of the present embodiments include, without limitation, zinc oxide, zinc sulfide, silicon, gallium nitride, germanium, silver, gold, a Group II-VI element, a Group III-V element, and a Group IV element).

Representative examples for materials suitable to be used as a solid shell (with or without a solid core therein) in the elongated tubular nanostructure of the present embodiments include, without limitation, a semiconductor substance, such as, but not limited to, silicon, gallium nitride, titanium, bismuth, tellurium, lead, silicon carbide, gallium arsenide, gallium phosphide-indium phosphide, indium arsenide, aluminum nitride, zinc oxide, zinc sulfide, indium oxide, indium tin oxide and cadmium sulfide.

In some embodiments of the present invention the core-shell nanostructure is fabricated prior to the unwrapping. This can be done, for example, using one or more of the techniques disclosed in International Publication No. WO 2010/052704, the contents of which are hereby incorporated by reference. In a representative process, a nanowire made of a crystalline substance (such as, but not limited to, zinc oxide, zinc sulfide, silicon, gallium nitride, germanium, silver, gold, a Group II-VI element, a Group III-V element, and a Group IV element) is grown, and a layer of an inorganic substance (e.g., a semiconductor substance, such as, but not limited to, silicon, gallium nitride, titanium, bismuth, tellurium, lead, silicon carbide, gallium arsenide, gallium phosphide-indium phosphide, indium arsenide, aluminum nitride, zinc oxide, zinc sulfide, indium oxide, indium tin oxide and cadmium sulfide) is epitaxially grown onto the nanowire. Preferably, the inorganic substance has a crystallinity mismatch with the sacrificial substance (e.g., mismatch of less than 4.5%). The nanowire can be grown, for example, by chemical vapor deposition (CVD) performed at conditions that affect axial growth of the nanowire.

According to some embodiments of the invention the invention the tubular nanostructure, once unwrapped, is made exclusively from silicon.

According to some embodiments of the invention the invention the core is made exclusively of germanium.

FIG. 13 is a schematic illustration of a nanostructure system 10, according to some embodiments of the present invention. System 10 comprises a substrate 14 and one or more non-tubular nanostructures 16 fabricated by a method as described herein or part thereof.

The nanostructures can be arranged in any arrangement. In the embodiment illustrated in FIG. 13, the nanostructures form a crossbar array in substrate 12. Shown are a first group 82 and second group 84. One or more of the nanostructures in group 82 can contact one or more of the nanostructures in group 84.

System 10 can be incorporated in many nanowire-based electronic devices, including, without limitation, nanoelectronic detection device, transparent circuit boards, field emission cathodes, display devices, light emitting devices, transistors, diodes, memory media, sensors, switches and the like.

For example, in some embodiments, system 10 is combined with electrodes, e.g., to form a transistor, such as a field effect transistor (FET). Such transistors can be used in integrated circuits, serving as components in, for example, logic gates, switches and other digital electronics components. System 10 can also be configured with an electrical circuit. For example, in some embodiments, the nanostructure (e.g., a nanowire and/or a nanoribbon) is connected to an AC or DC power source. In some embodiments, a device that includes a substrate on which is disposed a plurality of nanostructures (e.g., nanowires and/or nanoribbons) is fabricated.

Reference is now made to FIG. 14 which is a schematic illustration of a circuitry system, e.g., a circuit board, according to various exemplary embodiments of the present invention. The circuit board comprises system 10 and a plurality of additional components 62, such as, but not limited to, electrodes, semiconductor elements and contact pads. The additional electronic components can be of microscopic and/or millimeteric size as desired, and they are typically deposited on the planar surface such that at least some of the nanostructures contact one or more of these components. In some embodiments of the present invention there is at least one additional component which contacts more than one nanostructure.

The circuit board can be manufactured by depositing a plurality of additional electronic components on system 10.

FIG. 15 is a schematic illustration of an appliance 70 which includes a circuitry generally shown at 60. Circuitry 60 can comprise system 10 and additional components as further detailed hereinabove. Appliance 70 is typically, but not necessarily, a large area electronic appliance. Representative examples of appliances suitable for the present embodiments include, without limitation, a diode, a transistor (e.g., a field effect transistor), an optoelectronic system (e.g., a spatial imaging system, an optical computing system, an optical logic gate, an optoelectronic switch, a light emitting diode, a light detector, a photonic A/D converter, etc.), an electromechanical system, a thermoelectric system, an optomechanical system, a diode system, a transistor system, a display system (e.g., an active matrix display system), a projector display system, a sensor (e.g., an electrochemical sensor or a biosensor), an identification tag, a memory system, a smart card (e.g., a microprocessor card, cryptographic card, ATM card, subscriber identity module card also known as SIM card), and a projector display.

It is expected that during the life of a patent maturing from this application many relevant electronic appliances, particularly in the field of large area electronics will be developed and the scope of the term "appliance" is intended to include all such new technologies a priori.

In some embodiments, system 10 can be used for the analysis of an analyte. The analyte can be positioned in relation to the nanostructure of system 10 such that the analyte can be determined by determining a change in a characteristic of the nanostructure.

System 10 can thus be used for the detection of chemicals such as explosives and other hazardous chemicals, drugs, and the like, and of biological moieties such as cells, proteins, nucleic acids, carbohydrates, saccharides, lipids, antibodies, or other biological entities. In some embodiments, the nanostructure of system 10 is surface-functionalized. Surface-functionalization may be achieved, in some embodiments, by coating at least a portion of the nanostructure. In some embodiments, at least a portion of the nanostructure is functionalized by performing a chemical reaction on the surface of the nanostructure. Surface-functionalization can comprise attaching a functional moiety to the surface of the nanostructure. In some embodiments, a functional moiety may be attached directly to the surface of the nanostructure (i.e., through a chemical bond). In another embodiment, the functional moiety may be attached to a coating on the nanostructure.

The functional moieties may include simple functional groups, for example, but not limited to, —OH, —CHO, —COOH, —SO$_3$H, —CN, —NH$_2$, —SH, —CO$_2$H, COOR, or a halide; such groups can be generated on the nanostructure surface or attached to the nanostructure surface via a linker. For example, intrinsic reactive moieties on the nanostructure surface (e.g., hydroxy groups of a silicon nanostructure) can be used for reacting with an alkylsilicate or an arylsilicate that terminates with the desired functional group, via formation of —Si—O— bonds. Optionally, the functional group can be a biomolecular entity including, but not limited to, amino acids, proteins, sugars, DNA, antibodies, antigens, and enzymes; grafted polymer chains with chain length less than the diameter of the nanoscale wire core, including, but not limited to, polyamide, polyester, polyimide, polyacrylic; a thin coating (e.g., shell), covering the surface of the nanostructure core, including, but not limited to, the following groups of materials: metals, semiconductors, and insulators, which may be a metallic element, an oxide, an sulfide, a nitride, a selenide, a polymer and a polymer gel.

The functional moiety is optionally and preferably covalently attached to the nanostructures.

As used herein the term "about" refers to ±10%.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

The immense motivation to manipulate matter on the nanometer scale arises from the intriguing emergence of novel physical properties, and the ability of engineering a material's attributes by the controlled sculpting at the nanoscale. One-dimensional (1D) nanostructures, nanowires and nanotubes have attracted attention in recent years due to their electronic, optical, magnetic, and size-related chemical properties. Also known are nanoribbons (NRs) and nanomembranes (NMs) which exhibit small thicknesses and larger lateral dimensions.

Known synthetic methods for the preparation of semiconducting NRs, and NMs, include (i) thermal evaporation of II-IV semiconductor materials, e.g. ZnS, and CdS (ii) the chemical or mechanical exfoliation of solid materials with naturally layered structures, similarly to the formation of graphene from bulk graphite, such as the semiconductors MoS2, and GeSe; (iii) the release from bulk not naturally-layered semiconductor substrates, e.g. silicon, through the complex combination of anisotropic etching, metal deposition and lithographic procedures, and (iv) the epitaxial-based growth of releasable sacrificial multilayer assemblies for the formation of GaAs NRs, and (v) the use of wafer-bonded layered materials, e.g. silicon-on-insulator, followed by the NRs release by selective etching of the buried oxide layer.

It was found by the present inventors that, unlike the richly developed synthetic methods for nanowire structures, nanoribbons synthetic approaches suffer from several handicapping limitations. Thermal evaporation and exfoliation approaches yield large amounts of NRs from a narrow group of certain semiconductors, yet suffer from limited control over the dimensions, morphology, chemical composition and monodispersity of the resulting materials. Anisotropic etching, epitaxy and semiconductor-on-insulator based approaches slightly expand the material options available, and bring improvements on the lateral dimensions of the obtained NRs.

It was further found by the present inventors that the present requirement of specialized and complex etching procedures, the use of limited lithography for controlling NRs lateral dimensions, as well as strict epitaxy and bonding related constraints, handicap the spectrum of accessible NRs materials and the control over their critical attributes, such as width, thickness, length, chemical composition, shape, crystallinity, heterostructures synthesis and on-substrate assembly.

While searching for a technique for fabricating a nanoribbon, the present inventors realized that there are several challenges for such a fabrication. These include the development of improved methods to synthesize NRs with precise dimensions, down to a fraction of a nanometer along the length and thickness-axes; controlled materials nature and quality; to engineer structural features within single NRs to yield unusual charge, photon or phonon transport characteristics; to synthesize NRs that can deform into unusual shapes for non-planar 3D-structured substrates, and to create large-scale arrays of NR elements with defined geometry.

The present example demonstrates the development of a hitherto unreported universal approach for the controlled formation of semiconducting NRs, with a nearly 100% yield, based on the unwrapping of predecessor core-shell nanowire heterostructures. The method of the present embodiments allows for the fine tuning of the following NRs attributes: (1) Nanoribbon thickness can be controlled from ten of nanometers down to a few nanometers, (2) NRs width can be controlled by the diameter of the parent nanowire heterostructure, as well as the time applied for carving the shell before the unwrapping occurs, resulting in ribbons down to 10 nm in width or less (3) doping of single-element ribbons can be controlled during the NW shells deposition, (4) chemical composition of single-element and multiple-element alloyed ribbons achievable, (5) unreported nanoribbon heterostructures with thickness- and axially-controlled doping and chemical composition can be obtained by a newly developed doping-reflection approach, (6) nanoribbon shape controlled, (7) composite semiconductor-dielectric and semiconductor-organic multilayered NRs of higher complexity can be realized, (8) the on-place formation of super-thin NR elements, for example, less than 10 nm in thickness, on 3D-carved surfaces demonstrates their ability to conformally and intimately wrap around substrate sharp dentations.

The unwrapping mechanism discovered by the present inventors allows for the orthogonal selective chemical modification of NRs faces, unachievable by any existing approach. Also, the large-scale assembly of NR single elements on various substrates is demonstrated for the fabrication of NRs-based FET electrical devices, surface-supported and suspended, further applied in biosensing applications.

In the present example, on-substrate GeSi core-shell predecessor nanowire heterostructures, synthesized through conventional CVD-VLS reported procedures by the conformal epitaxial overcoating of crystalline germanium nanowire cores with a silicon shell, are controllably top-carved by an anisotropic reactive-ion-etching step, along with their side-protection by a thin layer of photoresist material, therefore unravelling the originally closed Si-shell structure prior the selective chemical removal of the sacrificial Ge core leading to the formation of crystalline fully opened and flat NRs structures, as schematically depicted in FIGS. 1A-F.

The NRs resulting width can be controlled by both the diameter of the Au catalysts employed for the growth of germanium sacrificial cores, as well as by the etching time applied for the top-carving of the closed Si-shell structure. This allows for the versatile control over lateral dimensions of the resulting NRs, FIGS. 2A and 2B-F, and FIGS. 12A-B. Furthermore, the thickness of resulting NRs is directly controlled by the originally deposited thickness of the Si shell in the predecessor GeSi core-shell nanowires, FIGS. 3A-F. FIGS. 2B-F show representative SEM images of SiNRs of decreasing widths, obtained by the above presented approach, after the time-controlled top-carving of GeSi nanowire heterostructures, of 50 nm core diameter and 10 nm shell thickness, and the selective chemical wet-etching of Ge cores by a mild $H_2O_2$ solution. NRs of unprecedented ultra-small widths, 10 nm, can be obtained by this approach. Germanium cores can be selectively removed by the wet-chemical etching, optionally and preferably without affecting the integrity and the crystallinity of the epitaxially-grown Si shells and the so resultant SiNRs, which unfold and conformally adhere to the hosting surface. The deposition of the precursor GeSi core-shell nanowires on holey silicon nitride-support film TEM grids substrates allows for the formation and further TEM characterization of NR elements.

HRTEM micrographs of typical SiNRs, FIGS. 2G-I, demonstrate the uniformity and high-quality single-crystalline structure along their entire length. In addition, wide-field selected-area diffraction (SAED), FIG. 2H inset, further confirms that the resulting NRs are indeed single crystalline. The lattice-plane spacing obtained for a typical NR, of 0.314 nm, fits well with the interplanar distance of cubic silicon. The two-dimensional Fourier transform of the lattice-resolved image (FIG. 2I inset) can be indexed to the diamond structure of silicon with a [111] growth direction. The resulting NRs are straight and smooth, with a uniform width along their longitudinal axis. Moreover, FIGS. 3A-F demonstrate the ability of the inventive technique to NR thickness (down to only ~3 nm) by adjusting the deposition time of the silicon shell of the precursor nanowires. It was found by the present inventors that by altering the Ge nanowires growth conditions, NRs of varying pre-designed tapered shapes can be formed, FIG. 9.

The Ge cores of Ge—Si top-carved nanowire heterostructures were selectively etched by two routes; (1) with $H_2O_2$ solution (wet etching) and (2) with $O_2$ gas at 500° C. (dry etching). FIGS. 4A-C depict the resulting Si NR structures after wet (FIG. 4C), and dry etching (FIG. 4B), respectively. It can be seen that the Si shell remaining after selective 'dry-etching' of Ge cores resembles a 'canoe-like' structure (FIG. 4B), whereas the Si shell that remains after selective wet-etching of Ge cores totally unfolds and conformally adheres to the hosting surface (FIG. 4C). Without wishing to be bound to any particular theory, it is believed that capillary forces, during the etching and post-drying steps, accompany the unwrapping process.

A unique advantage of the inventive technique resides in its ability to rationally control over the chemical composition of the resulting NRs, along their length and thickness axes; a task unattainable by existing synthetic methodologies. This can be achieved, for example, by the direct doping of the shell structure during the synthesis of core-shell precursors, for single-shelled nanowires, or by the formation of multi-element alloy (or SiGe graded shell), such as Ge(core)-$Si_xGe_{1-x}$ (shell) nanowire precursors, before the formation of NRs is performed.

FIG. 5A demonstrates the integration of p-type (1:4000 B:Si boron-doped) SiNR elements into electrical back-gated FET devices, and their evaluation by electrical transport measurements. FIG. 5A, and inset, depicts the $I_{ds}$ vs. $V_{ds}$ of an individual p-type SiNR FET at different gate voltages ($V_g$), and the transconductance curve ($I_{sd}$ vs. $V_g$ at a constant $V_{ds}$=0.1V), respectively. The observed gate-voltage behavior is typical of p-type FETs and similar to past reported nanowire-based FET devices. In contrast, undoped intrinsic SiNRs and n-type (phosphorous-doped) SiNRs show electrical behaviors as typically expected from their composition. Furthermore, the present inventors have employed the doped NR elements as building blocks for the fabrication of biosensing devices, as demonstrated in FIG. 5B for the sensitive sensing of solution pH. Additionally, multi-element single-crystalline SiGe alloy NRs can be readily synthesized by this simple methodology.

Synthesis of complex multicomponent 1D NRs is also contemplated. The creation of heterojunctions has led to materials with multiple functionalities not realized in single-component nanostructures, useful in a broad range of applications. In this regard, the controlled ability to modulate a NR's chemical composition along its length, as well as its thickness, axes has not yet been demonstrated by known methods. The thickness-axis chemical modulation of NRs can be directly achieved by the ab-initio synthesis of Ge core-multishell nanowire precursors. The top-carving and subsequent unwrapping of NWs in accordance with some embodiments of the present invention leads to the thickness-modulated doping of NRs, or thickness-modulated alloy-graded NRs.

The present inventors also developed a 'doping-reflection' approach, FIG. 6A. By this method, axially-modulated Ge-core precursor NWs are synthesized. Next, a shell of undoped Si of controlled thickness is deposited, before a high-temperature annealing step, between 750-850 C.°, is applied to promote the 'radial' controlled diffusion of dopant atoms, from the originally doped Ge-core into the undoped iSi shell.

FIG. 6B shows the current-voltage (I-V) electrical behavior recorded on a representative four-contact device fabricated from an axially-graded p/n-type dually-doped SiNR structure, revealing a clear current rectification in reverse bias with an onset at a forward bias voltage, consistent with the synthesis of a well-defined p-n diode within the NR structure. These results show, for the first time, that dopant atoms in the sacrificial cores can be effectively 'reflected' into the shell structures by simple time-controlled high-temperature annealing of the core-shell NW predecessors, leading the subsequent formation of axially-modulated NRs heterostructures.

The technique of the present embodiments can be used for forming of crystallinity-modulated NRs along their length axis. The synthesis of nanowire structures with their crystal orientation modulated along the axial axis, by the modulation of growth temperature and pressure, was recently reported, and serve as the basis for the creation of crystallinity-modulated NRs. The synthesis of AB-type Ge(111)-Ge(100) nanowire cores leads to the epitaxial deposition of a similarly configured Si(111)-Si(100) shell structure, and the subsequent creation of Si(111)-Si(110) NR heterostructures.

The technique of the present embodiments can be employed for the creation of composite NR heterostructures, consisting of components other than semiconductor elements; such as dielectric, metallic, organic materials and their combination. For instance, semiconductor-dielectric layered NRs, and dielectric NRs, can be formed from the respective core-shell NW precursors.

The high-fidelity large-scale assembly of 1D nano-materials, with controlled and uniform orientation and density, at spatially well-defined locations on diverse substrates has been the focus of enormous research efforts for the last two decades. While significant progress has been achieved for the assembly of nanowire materials, only scarce research has dealt with the large-scale controlled assembly of ultrathin and narrow nanoribbon building blocks, merely due to the limited availability of synthetic methods.

The present inventors successfully created large-scale arrays of NR elements. First oriented contact-transfer of the precursor core-shell NWs is performed on the surface of interest, followed by the location-controlled photoresist masking of NWs of interest, surrounding-NWs etching, and by the controlled top-carving and unwrapping of protected NWs into the resulting NRs.

FIGS. 7A-B show the formation of large-scale position-controlled assembly of NRs on different surfaces, from silicon wafers to plastic substrates. The above mentioned procedure can be applied on 3D carved surfaces of complex morphologies, FIGS. 8A-C. Deposition of the core-shell NW precursors on sharply-carved substrates mainly leads to the formation of suspended NW elements, FIG. 8A. Suspended NWs slightly bend down to some extent, depending on the nanowire's diameter, but do never conformally cover the sharply-carved substrates.

In-situ unwrapping of the suspended NW predecessors, for shell thicknesses of less than 10 nm, leads to the formation of NRs that adhere and perfectly conform to the 3D pre-existent curvature. This shows the extreme flexibility of the resulting super-thin and narrow NRs, FIG. 8C. Nanoribbon elements can conform to carved substrates even at the sharpest turning angles, without affecting their integrity and electrical conductivity. The conformal flexibility of NRs can be directly controlled by the thickness of the precursor NW's shells before it's unwrapping. Thicker shells, >15 nm, tend to lead to partially or totally suspended NRs, FIG. 8B. Furthermore, NRs devices, suspended or not, can be readily fabricated on flexible materials, e.g. PDMS. This can be used, for example, for the fabrication of conformable multidimensional electronic devices able to undergo extreme mechanical deformation (e.g. bending, stretching, or twisting) without degradation of their properties. The technique of the present embodiments allows the on-surface direct formation of the thinnest and narrowest ever demonstrated NRs, optionally and preferably without compromising the physical integrity of these intrinsically ultrasensitive materials, unlike current methods which involve the prior synthesis and subsequent transferring of NRs into the device substrate.

The approach of the present embodiments allows the control over all NRs dimensions. For example, NRs of thicknesses between 1-50 nm, and lateral width between 2-200 nm can be obtained. NRs chemical composition can be modulated, leading to NRs of controlled doping ratio and elemental composition, both along their axial and thickness main axes. The former is achieved by a newly demonstrated 'doping reflection' approach. NR heterostrutures of controlled mixed crystallinity can be synthesized as well. Multicomponent layered NRs, controllably combining semiconducting and dielectric materials, are also contemplated. The approach of the present embodiments also allows the realization of hierarchically branched NR-based superstructures, with a complete selective control over dimensions and chemical composition of backbone and branch elements.

The controlled surface assembly of single NR elements can make use of the extensively developed approaches for the controlled assembly of NW materials, along with the subsequently on-substrate mild formation of NR elements. The NR of the present embodiments can be formed on any surface of interest, from flexible and temperature-sensitive elastomeric substrates, e.g. PDMS, through plastics to semiconductor wafers. The method of the present embodiments allows the realization of ultra-thin cross-section NRs, down to 1-2 nm, without concerns on deterioration of NRs integrity, caused by unnecessary by manipulation steps. Superflexible NR elements of the smallest thicknesses show an ability to adhere and conform on nearly any 3D-carved surface of complex morphology, optionally and preferably without compromising the electrical attributes of the NR elements.

Materials and Methods:
Growth of Ge—Si Core-Shell Nanowires
Crystalline germanium nanowire templates (as depicted in FIG. 10A) were grown on (100) silicon wafers by the vapor-liquid-solid (VLS) mechanism, from gold nanoclusters (purchased from Ted Pella, Inc.), followed by conformally and epitaxially overcoating the cores with a silicon shell (and various reactants/dopants), with the use of a homemade chemical vapor deposition (CVD) system. The first step involves the deposition of gold nanoclusters of the desired diameter on a silicon wafer, as seeds for the germanium-nanowire axial growth. The growth substrate was then placed inside a CVD system for the synthesis of the Ge—Si core-shell nanowires. The diameter of the nanoparticles defined the diameter of the germanium core and the resultant inner diameter of the silicon nanotubes.[19] The second step refers to the formation of the germanium-core template, with the use of germane ($GeH_4$) as a precursor and $H_2$ as a carrier gas in a well-known two-step CVD process.[20] The first step was carried out at 315° C. and 400 Torr, using a 10% $GeH_4$ (flow rate 40 sccm), diluted with $H_2$ (flow rate 200 sccm), to form nucleation sites for the following axial core-growth step, which occurred at a lower temperature (280° C.). The subsequent introduction of silane ($SiH_4$) (flow rate 5 sccm) into a mixture of $H_2$ (flow rate 10 sccm) and Ar (flow rate 5 sccm) as carrier gases, at a temperature of 450° C. and a pressure of 1 Torr, leads to the conformal and epitaxial formation of the silicon shell on top of the germanium-nanowire core. The Si shell thickness of the Ge—Si core shell nanowires can be easily controlled by the shell deposition time. FIGS. 10B-D show mixed SE/BSE (50%/50%) SEM images of Ge—Si core-shell nanowires with various shell thicknesses.

Top Carving of a Si Shell

The top carving of a Si shell in a Ge—Si core shell nanowires was done by dry etching. Initially, core-shell nanowire heterostructures were harvested from the growth substrate by sonication in ethanol and casted onto Si wafer with 600 nm thermal $SiO_2$. In order to allow only the top carving of the Si shell, the wafer with core-shell nanowire heterostructures coated with PMMA A2 resist (purchased from MicroChem) by spinning at 5000 rpm for 60 s, followed by baking at 180° C. on a hot plate for 3 min. In the next step, the top carving of a Si shell in a Ge—Si core shell nanowires was done in DRIE by dry etching under the following conditions: $SF_6$ flow rate 50 sccm, $C_4F_8$ flow rate 10 sccm, total pressure 5 mTorr, and bias plasma 100 W. FIG. 11 shows SEM image of top carved Ge—Si core-shell nanowires.

Etching of the Inner Germanium-Nanowire Core

The etching step of the inner germanium-nanowire core is carried out in a solution of 30% hydrogen peroxide at 60° C. for 30 min. Alternatively, the core material was etched away by the dry thermal oxidation of germanium in the presence of $O_2$ at 500° C., and the simultaneous vaporization of the germanium oxide.

Nanoribbons FET Fabrication

Initially, metal contacts for outer electrodes were defined on a silicon substrate with a 600 nm thick oxide layer by photolithography using a multilayer resist structure consisting of 300 nm LOR3A copolymer (purchased from MicroChem) and 500 nm Shipley 1805 photoresist (purchased from MicroChem), followed by thermal evaporation of a Cr/Au of 5 nm and 60 nm respectively. Then the Ge—Si core-shell nanowires were dispersed on the chip and transformed to nanoribbons as described above. In the following step, passivated source and drain electrodes were deposited with the use of a multilayer photoresist structure consisting of 300 nm LOR3A copolymer (purchased from MicroChem) and 500 nm Shipley 1805 photoresist (purchased from MicroChem). After exposure, development of the electrode pattern, and removal of native $SiO_2$ layer from nanoribbons by dipping the device in a $HF/NH_4F$ 6:1 (v/v) buffer solution (BOE) for ~4 s, the contacts were metallized by e-beam evaporation of Ti/Pd/Ti (5/60/10 nm) respectively and were then passivated from the electrolyte with an insulating layer of $SiN_x$ (~50 nm-thick) deposited by plasma-enhanced chemical vapor deposition (PECVD). The separation between the source and drain electrodes for each FET was 2 µm.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

REFERENCES

[1] Y. Xia, P. Yang, Y. Sun, Y. Wu, B. Mayers, B. Gates, Y. Yin, F. Kim, H. Yan, Advanced Materials 2003, 15, 353-389; N. Shpaisman, U. Givan, M. Kwiat, A. Pevzner, R. Elnathan, F. Patolsky, The Journal of Physical Chemistry C 2012, 116, 8000-8007.

[2] R. Elnathan, M. Kwiat, A. Pevzner, Y. Engel, L. Burstein, A. Khatchtourints, A. Lichtenstein, R. Kantaev, F. Patolsky, Nano Letters 2012, 12, 5245-5254; V. Krivitsky, L.-C. Hsiung, A. Lichtenstein, B. Brudnik, R. Kantaev, R. Elnathan, A. Pevzner, A. Khatchtourints, F. Patolsky, Nano Letters 2012, 12, 4748-4756.

[3] J. A. Rogers, M. G. Lagally, R. G. Nuzzo, Nature 2011, 477, 45-53.

[4] K. S. Novoselov, D. Jiang, F. Schedin, T. J. Booth, V. V. Khotkevich, S. V. Morozov, A. K. Geim, Proceedings of the National Academy of Sciences of the United States of America 2005, 102, 10451-10453.

[5] K. S. Novoselov, A. K. Geim, S. V. Morozov, D. Jiang, Y. Zhang, S. V. Dubonos, I. V. Grigorieva, A. A. Firsov, Science 2004, 306, 666-669.

[6] J. N. Coleman, M. Lotya, A. O'Neill, S. D. Bergin, P. J. King, U. Khan, K. Young, A. Gaucher, S. De, R. J. Smith, I. V. Shvets, S. K. Arora, G. Stanton, H.-Y. Kim, K. Lee, G. T. Kim, G. S. Duesberg, T. Hallam, J. J. Boland, J. J. Wang, J. F. Donegan, J. C. Grunlan, G. Moriarty, A. Shmeliov, R. J. Nicholls, J. M. Perkins, E. M. Grieveson, K. Theuwissen, D. W. McComb, P. D. Nellist, V. Nicolosi, Science 2011, 331, 568-571.

[7] H. C. Ko, A. J. Baca, J. A. Rogers, Nano Letters 2006, 6, 2318-2324.

[8] J. Yoon, S. Jo, I. S. Chun, I. Jung, H. S. Kim, M. Meitl, E. Menard, X. L. Li, J. J. Coleman, U. Paik, J. A. Rogers, Nature 2010, 465, 329-U380.

[9] S. Kim, J. Wu, A. Carlson, S. H. Jin, A. Kovalsky, P. Glass, Z. Liu, N. Ahmed, S. L. Elgan, W. Chen, P. M. Ferreira, M. Sitti, Y. Huang, J. A. Rogers, Proceedings of the National Academy of Sciences 2010, 107, 17095-17100.

[10] L. J. Lauhon, M. S. Gudiksen, C. L. Wang, C. M. Lieber, Nature 2002, 420, 57-61; M. Ben-Ishai, F. Patolsky, Advanced Materials 2010, 22, 902-906; M. B. Ishai, F. Patolsky, Angewandte Chemie 2009, 121, 8855-8858.
[11] W. Primak, Kampwirt. R, Y. Dayal, Journal of the Electrochemical Society 1967, 114, 88-91.
[12] F. Patolsky, G. F. Zheng, C. M. Lieber, Nature Protocols 2006, 1, 1711-1724.
[13] Y. Cui, Q. Q. Wei, H. K. Park, C. M. Lieber, Science 2001, 293, 1289-1292.
[14] M. B. Ishai, F. Patolsky, Journal of the American Chemical Society 2009, 131, 3679-3689.
[15] M. Ben-Ishai, F. Patolsky, Nano Letters 2012, 12, 1121-1128.
[16] F. L. Via, C. Spinella, E. Rimini, Semiconductor Science and Technology 1995, 10, 1362.
[17] A. Lugstein, M. Steinmair, Y. J. Hyun, G. Hauer, P. Pongratz, E. Bertagnolli, Nano Letters 2008, 8, 2310-2314.
[18] Y.-Z. Long, M. Yu, B. Sun, C.-Z. Gu, Z. Fan, Chemical Society Reviews 2012, 41, 4560-4580.
[19] Y. Cui, L. J. Lauhon, M. S. Gudiksen, J. Wang, C. M. Lieber, Applied Physics Letters 2001, 78, 2214-2216
[20] A. B. Greytak, L. J. Lauhon, M. S. Gudiksen, C. M. Lieber, Applied Physics Letters 2004, 84, 4176-4178.
[21] M. B. Ishai, F. Patolsky, Journal of the American Chemical Society 2009, 131, 3679-3689.

What is claimed is:

1. A method of fabricating a nanostructure, comprising:
forming an elongated tubular nanostructure having a core-shell structure on a generally planar substrate such that a longitudinal axis is generally parallel to said substrate;
forming on said substrate a protective layer having a thickness less than a diameter of said tubular nanostructure, thereby partially burying said tubular nanostructure in said protective layer;
generating conditions for said tubular nanostructure to unwrap, by etching an unburied portion of said tubular nanostructure and removing said protective layer; and
selectively removing said core following said removal of said protective layer;
thereby forming a non-tubular nanostructure.

2. The method according to claim 1, wherein said generating said conditions comprises etching a portion of said tubular nanostructure along a longitudinal axis of said tubular nanostructure.

3. The method according to claim 1, wherein said forming said protective layer comprises, applying a layer having a thickness of at least said diameter of said tubular nanostructure, and selectively reducing a thickness of said layer to said thickness less than said diameter.

4. The method according to claim 1, wherein said tubular nanostructure comprises an inorganic substance.

5. The method according to claim 1, wherein said tubular nanostructure comprises an organic substance.

6. The method according to claim 1, wherein said tubular nanostructure comprises a dielectric substance.

7. The method according to claim 1, wherein said tubular nanostructure comprises a semiconductor inorganic substance.

8. The method according to claim 1, wherein said tubular nanostructure comprises at least one substance selected from the group consisting of silicon (Si), gallium nitride (GaN), titanium (Ti), bismuth (Bi), tellurium (Te), lead (Pb) silicon carbide (SiC), gallium arsenide (GaAs), gallium phosphide (GaP), indium phosphide (InP), indium arsenide (InAs), aluminum nitride (AlN), zinc oxide (ZnO), zinc sulfide (ZnS), indium oxide (InO), indium tin oxide (ITO) and cadmium sulfide (CdS).

9. The method according to claim 1, wherein said tubular nanostructure comprises silicon.

10. The method according to claim 1, wherein said tubular nanostructure, once unwrapped, is made exclusively from silicon.

11. The method according to claim 1, wherein said core comprises at least one substance selected from the group consisting of germanium (Ge), zinc oxide (ZnO), zinc sulfide (ZnS), silicon (Si), gallium nitride (GaN), silver (Ag), gold (Au), a Group II-VI element, a Group III-V element, and a Group IV element.

12. The method according to claim 3, wherein said core is made exclusively of germanium.

13. A nanostructure system, comprising a substrate and a non-tubular nanostructure fabricated by the method according to claim 1.

14. The system according to claim 13, comprising a plurality of nanostructures.

15. The system according to claim 13, serving as or being incorporated in a system selected from the group consisting of an electronic circuitry system, an optoelectronic system, an electromechanical system, a thermoelectric system, an optomechanical system, a sensor, a diode system, a transistor system, a memory system, an imaging system, a display system, a projector display system, an identification tag system and a smart card system.

16. An article of manufacture, comprising a tubular nanostructure having an outermost layer, wherein an elongated section of said outermost layer is open such that said outermost layer is cut-open to expose an interior of said tubular nanostructure to an environment outside said outermost layer, said section being generally parallel to a longitudinal axis of said nanostructure, and wherein said nanostructure is at least partially buried in a protective layer supporting side walls of said nanostructure such that said open section is uncoated by said protective layer.

17. The article of manufacture of claim 16, wherein said section is along an entire length of said nanostructure.

18. The article of manufacture of claim 16, wherein said interior comprises a solid core.

19. The article of manufacture of claim 16, wherein said interior is hollowed.

20. A method of fabricating a nanostructure, comprising:
forming on a generally planar substrate an elongated tubular nanostructure such that a longitudinal axis is generally parallel to said substrate;
forming on said substrate a protective layer having a thickness of at least a diameter of said tubular nanostructure; and
generating conditions for said tubular nanostructure to unwrap by applying an etching process to reduce a thickness of said layer and said tubular nanostructure to a thickness below a diameter of said tubular nanostructure prior to said etching, and selectively removing said protective layer to expose sides of said tubular nanostructure.

21. The method according to claim 20, wherein said generating said conditions comprises etching a portion of said tubular nanostructure along a longitudinal axis of said tubular nanostructure.

22. The method according to claim 21, wherein said tubular nanostructure has a core-shell structure, and the method further comprises selectively removing said core following said etching.

23. The method according to claim 22, wherein said core comprises at least one substance selected from the group consisting of germanium (Ge), zinc oxide (ZnO), zinc sulfide (ZnS), silicon (Si), gallium nitride (GaN), silver (Ag), gold (Au), a Group II-VI element, a Group III-V element, and a Group IV element.

24. The method according to claim 22, wherein said core is made exclusively of germanium.

25. The method according to claim 20, wherein said tubular nanostructure comprises an inorganic substance.

26. The method according to claim 20, wherein said tubular nanostructure comprises an organic substance.

27. The method according to claim 20, wherein said tubular nanostructure comprises a dielectric substance.

28. The method according to claim 20, wherein said tubular nanostructure comprises a semiconductor inorganic substance.

29. The method according to claim 20, wherein said tubular nanostructure comprises at least one substance selected from the group consisting of silicon (Si), gallium nitride (GaN), titanium (Ti), bismuth (Bi), tellurium (Te), lead (Pb) silicon carbide (SiC), gallium arsenide (GaAs), gallium phosphide (GaP), indium phosphide (InP), indium arsenide (InAs), aluminum nitride (AlN), zinc oxide (ZnO), zinc sulfide (ZnS), indium oxide (InO), indium tin oxide (ITO) and cadmium sulfide (CdS).

30. The method according to claim 20, wherein said tubular nanostructure comprises silicon.

31. The method according to claim 20, wherein said tubular nanostructure, once unwrapped, is made exclusively from silicon.

32. A nanostructure system, comprising a substrate and a non-tubular nanostructure fabricated by the method according to claim 20.

33. The system according to claim 32, comprising a plurality of nanostructures.

34. The system according to claim 32, serving as or being incorporated in a system selected from the group consisting of an electronic circuitry system, an optoelectronic system, an electromechanical system, a thermoelectric system, an optomechanical system, a sensor, a diode system, a transistor system, a memory system, an imaging system, a display system, a projector display system, an identification tag system and a smart card system.

* * * * *